United States Patent
Shih et al.

(10) Patent No.: US 11,410,890 B2
(45) Date of Patent: Aug. 9, 2022

(54) EPITAXIAL LAYERS IN SOURCE/DRAIN CONTACTS AND METHODS OF FORMING THE SAME

(71) Applicant: Taiwan Semiconductor Manufacturing Co., Ltd., Hsin-Chu (TW)

(72) Inventors: Ding-Kang Shih, New Taipei (TW); Pang-Yen Tsai, Hsin-Chu Hsian (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 78 days.

(21) Appl. No.: 16/216,359

(22) Filed: Dec. 11, 2018

(65) Prior Publication Data

US 2020/0006159 A1    Jan. 2, 2020

Related U.S. Application Data

(60) Provisional application No. 62/691,084, filed on Jun. 28, 2018.

(51) Int. Cl.
*H01L 21/8238* (2006.01)
*H01L 29/45* (2006.01)
(Continued)

(52) U.S. Cl.
CPC ...... *H01L 21/823871* (2013.01); *C30B 25/02* (2013.01); *C30B 29/08* (2013.01);
(Continued)

(58) Field of Classification Search
CPC ......... H01L 21/823871; H01L 29/7848; H01L 27/0924; H01L 21/823814;
(Continued)

(56) References Cited

U.S. PATENT DOCUMENTS 8,772,109 B2    7/2014 Colinge
8,785,285 B2    7/2014 Tsai et al.
(Continued)

OTHER PUBLICATIONS

Bauer, M & Thomas, S.G., "Low temperature catalyst enhanced etch process with high etch rate selectivity for amorphous silicon based alloys over single-crystalline silicon based alloys," Thin Solid Films, 2012, pp. 3139-3143, vol. 520, Issue 8.

*Primary Examiner* — Marcos D. Pizarro
*Assistant Examiner* — Quinton A Brasfield
(74) *Attorney, Agent, or Firm* — Haynes and Boone, LLP

(57) ABSTRACT

A method includes providing a p-type S/D epitaxial feature and an n-type source/drain (S/D) epitaxial feature, forming a semiconductor material layer over the n-type S/D epitaxial feature and the p-type S/D epitaxial feature, processing the semiconductor material layer with a germanium-containing gas, where the processing of the semiconductor material layer forms a germanium-containing layer over the semiconductor material layer, etching the germanium-containing layer, where the etching of the germanium-containing layer removes the germanium-containing layer formed over the n-type S/D epitaxial feature and the semiconductor material layer formed over the p-type S/D epitaxial feature, and forming a first S/D contact over the semiconductor material layer remaining over the n-type S/D epitaxial feature and a second S/D contact over the p-type S/D epitaxial feature. The semiconductor material layer may have a composition similar to that of the n-type S/D epitaxial feature.

20 Claims, 16 Drawing Sheets

(51) Int. Cl.
| | |
|---|---|
| C30B 29/52 | (2006.01) |
| C30B 29/08 | (2006.01) |
| C30B 33/12 | (2006.01) |
| H01L 21/02 | (2006.01) |
| H01L 21/3065 | (2006.01) |
| H01L 21/285 | (2006.01) |
| H01L 21/768 | (2006.01) |
| H01L 23/535 | (2006.01) |
| H01L 27/092 | (2006.01) |
| H01L 29/08 | (2006.01) |
| H01L 29/161 | (2006.01) |
| H01L 29/24 | (2006.01) |
| C30B 25/02 | (2006.01) |

(52) U.S. Cl.
CPC .............. *C30B 29/52* (2013.01); *C30B 33/12* (2013.01); *H01L 21/02521* (2013.01); *H01L 21/02532* (2013.01); *H01L 21/28518* (2013.01); *H01L 21/3065* (2013.01); *H01L 21/76805* (2013.01); *H01L 21/76886* (2013.01); *H01L 21/76895* (2013.01); *H01L 21/823814* (2013.01); *H01L 21/823821* (2013.01); *H01L 23/535* (2013.01); *H01L 27/0924* (2013.01); *H01L 29/0847* (2013.01); *H01L 29/161* (2013.01); *H01L 29/24* (2013.01); *H01L 29/45* (2013.01)

(58) Field of Classification Search
CPC ......... H01L 21/02532; H01L 29/66636; H01L 21/823418
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,412,840 B1* | 8/2016 | Leobandung | H01L 29/66628 |
| 9,520,482 B1 | 12/2016 | Chang et al. | |
| 9,576,814 B2 | 2/2017 | Wu et al. | |
| 2008/0102573 A1* | 5/2008 | Liang | H01L 29/7848 257/E29.267 |
| 2014/0183645 A1* | 7/2014 | Wann | H01L 21/823871 257/369 |
| 2016/0049401 A1* | 2/2016 | Sung | H01L 29/66545 257/369 |
| 2016/0104673 A1* | 4/2016 | Tung | H01L 21/76897 257/288 |
| 2016/0329431 A1* | 11/2016 | Glass | H01L 29/0669 |

* cited by examiner

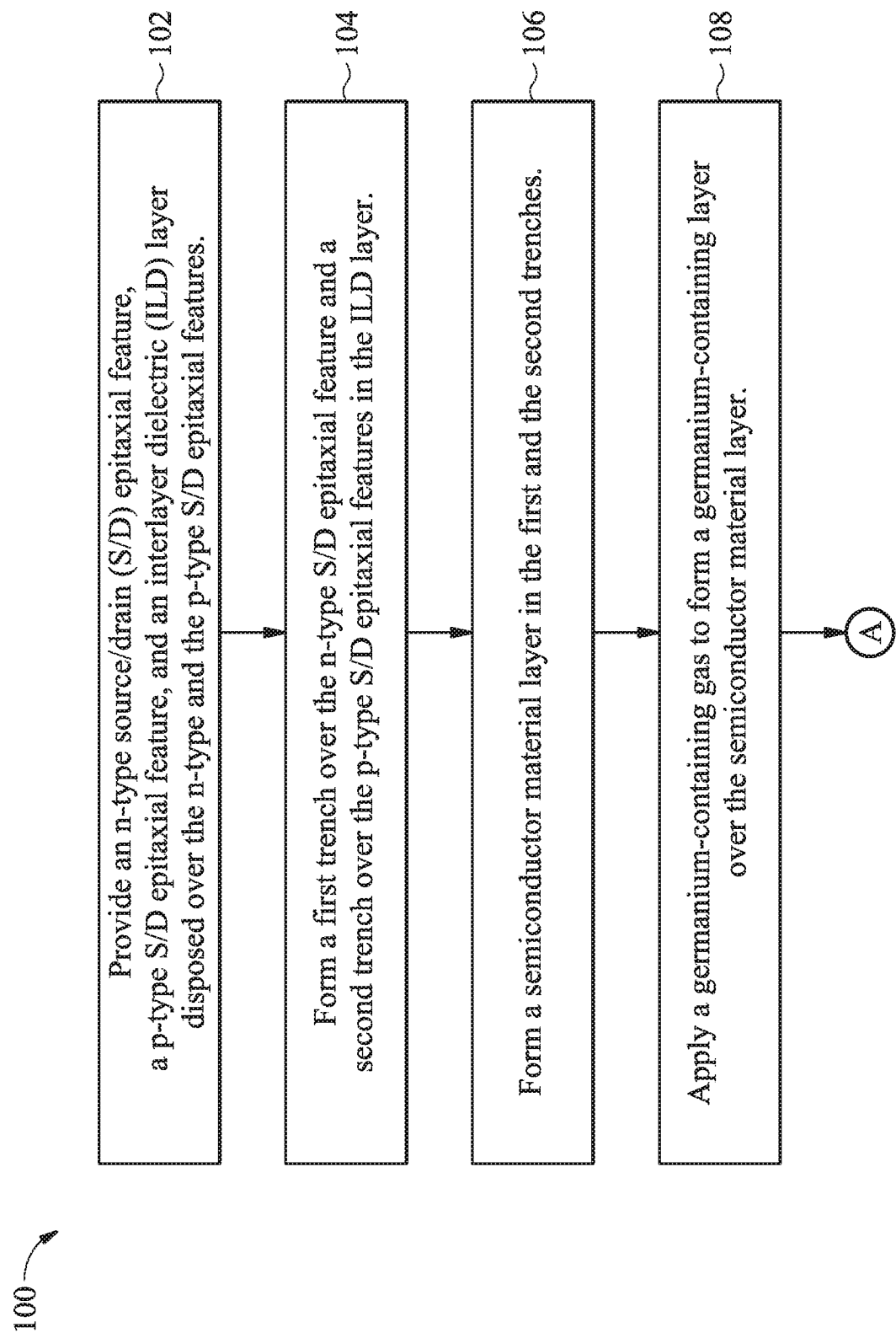

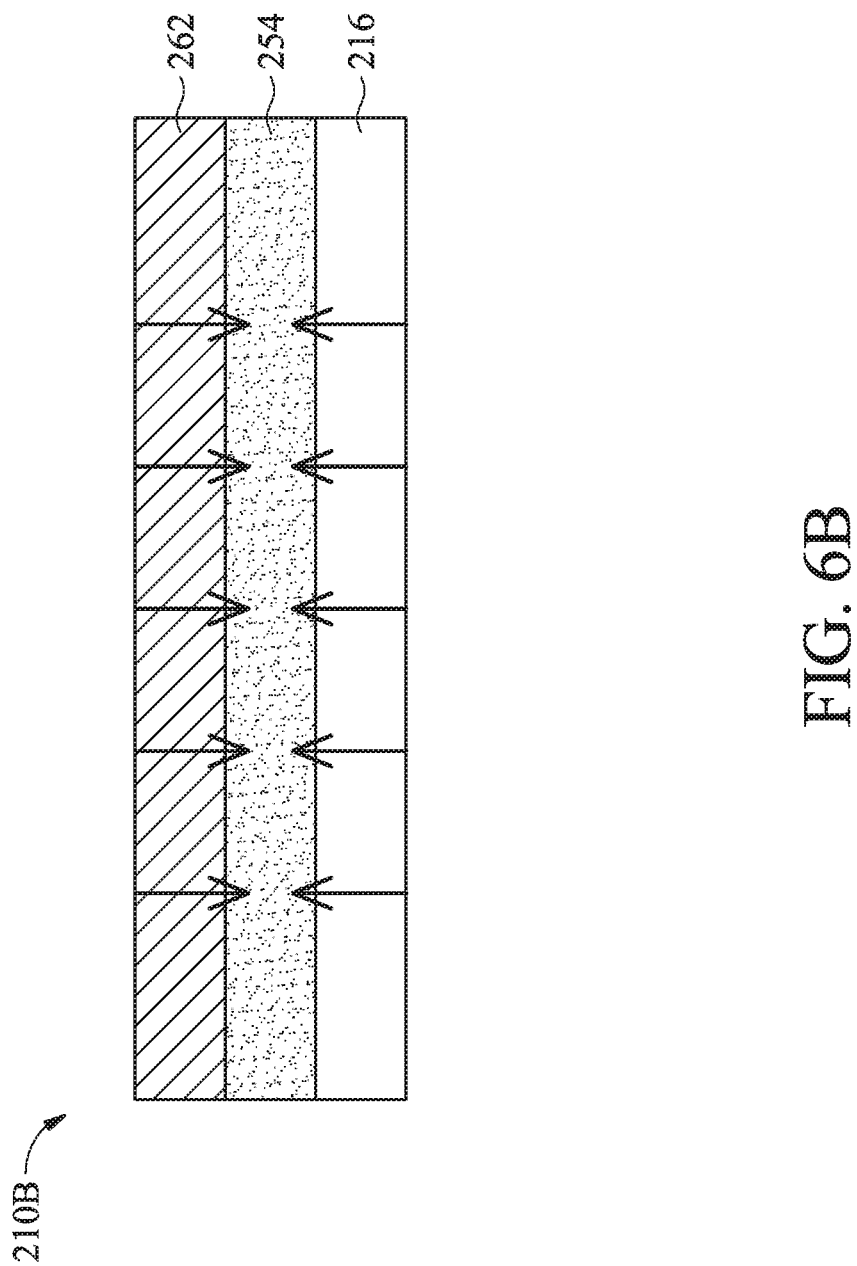

EPITAXIAL LAYERS IN SOURCE/DRAIN CONTACTS AND METHODS OF FORMING THE SAME

PRIORITY DATA

This application claims priority to U.S. Provisional Patent Application Ser. No. 62/691,084 filed Jun. 28, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, efforts have been made in fabricating IC devices having improved performance, including reduced resistance at the interface between source/drain features and contacts formed thereon. Although methods of achieving such reduced resistance have been generally adequate, they have not been satisfactory in all respects. In some instances, such methods may generally involve complex processing steps (thus increased production cost) and may inadvertently subject the IC devices to thermal damage. For these and other reasons, improvements in this respect are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B are flow diagrams of a method of fabricating a workpiece according to various aspects of the present disclosure.

FIG. 6B illustrates a portion of the workpiece of FIG. 6A during an intermediate fabrication stage of a method according to various aspects of the present disclosure.

DETAILED DESCRIPTION

Figure 1B:
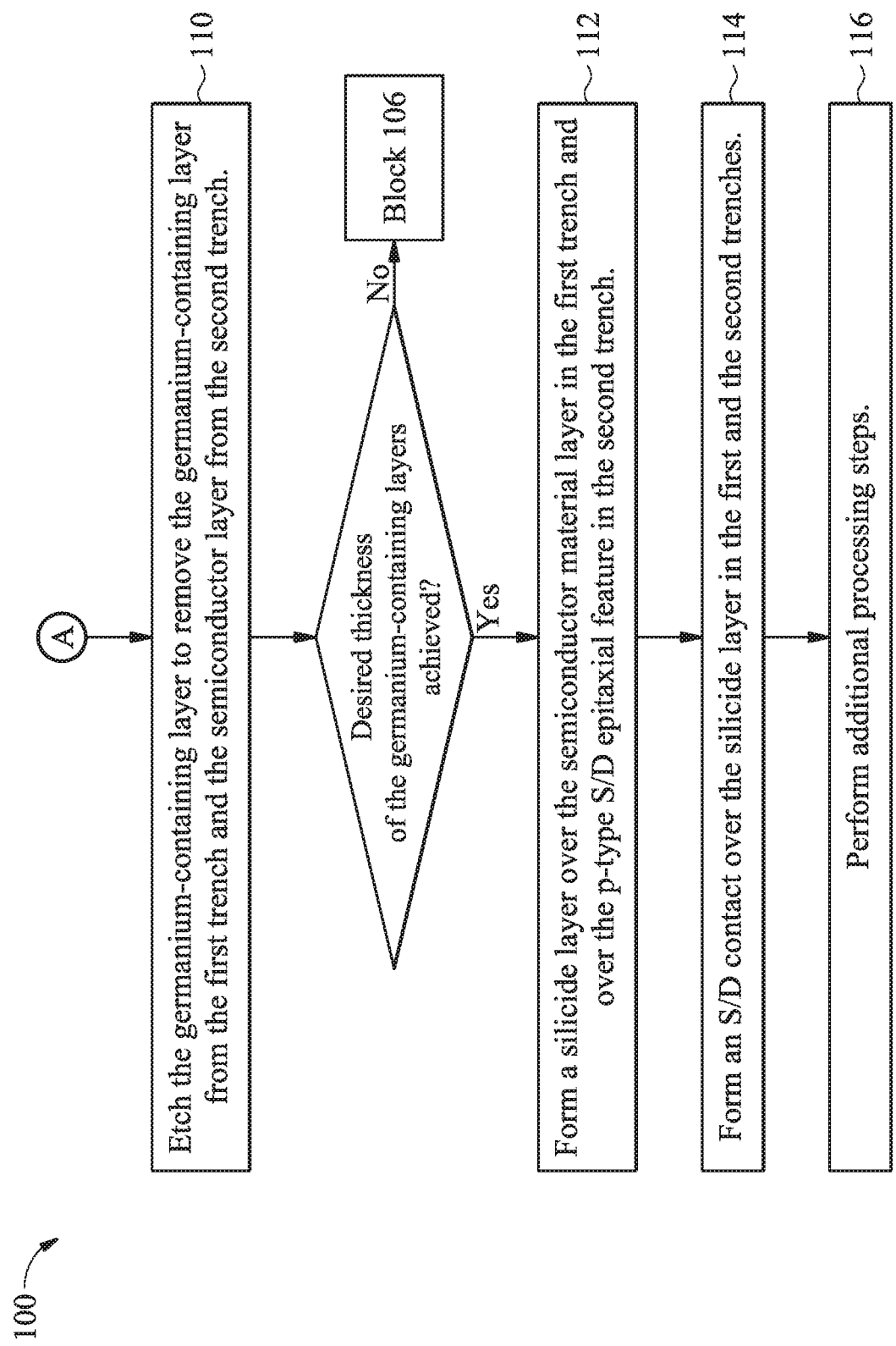

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication thereof. More particularly, some embodiments are related to forming source and drain (S/D) contacts in field effect transistors (FETs), such as planar or three-dimensional (fin-like) FETs, that include an n-type FET (or NFET) region and a p-type FET (or PFET) region. Furthermore, the disclosed methods provide an approach to form S/D contacts with reduced contact resistance by forming low-resistance epitaxial semiconductor layers between S/D features and the S/D contacts, particularly in the NFET region. In some embodiments, n-type epitaxial semiconductor layers including, for example, silicon or silicon carbon doped with phosphorous or arsenic, are selectively formed over the NFET S/D features but not over the PFET S/D features. The n-type epitaxial semiconductor layers disclosed herein may be formed by processes (e.g., lower processing temperature) different from those for forming n-type epitaxial S/D features, resulting in improved electrical properties. In at least some embodiments, by selectively forming the n-type epitaxial semiconductor layers using the disclosed methods, thermal damages, processing complexity, and production cost incurred during device fabrication processes may be reduced and the device performance may be enhanced.

Figure 2:
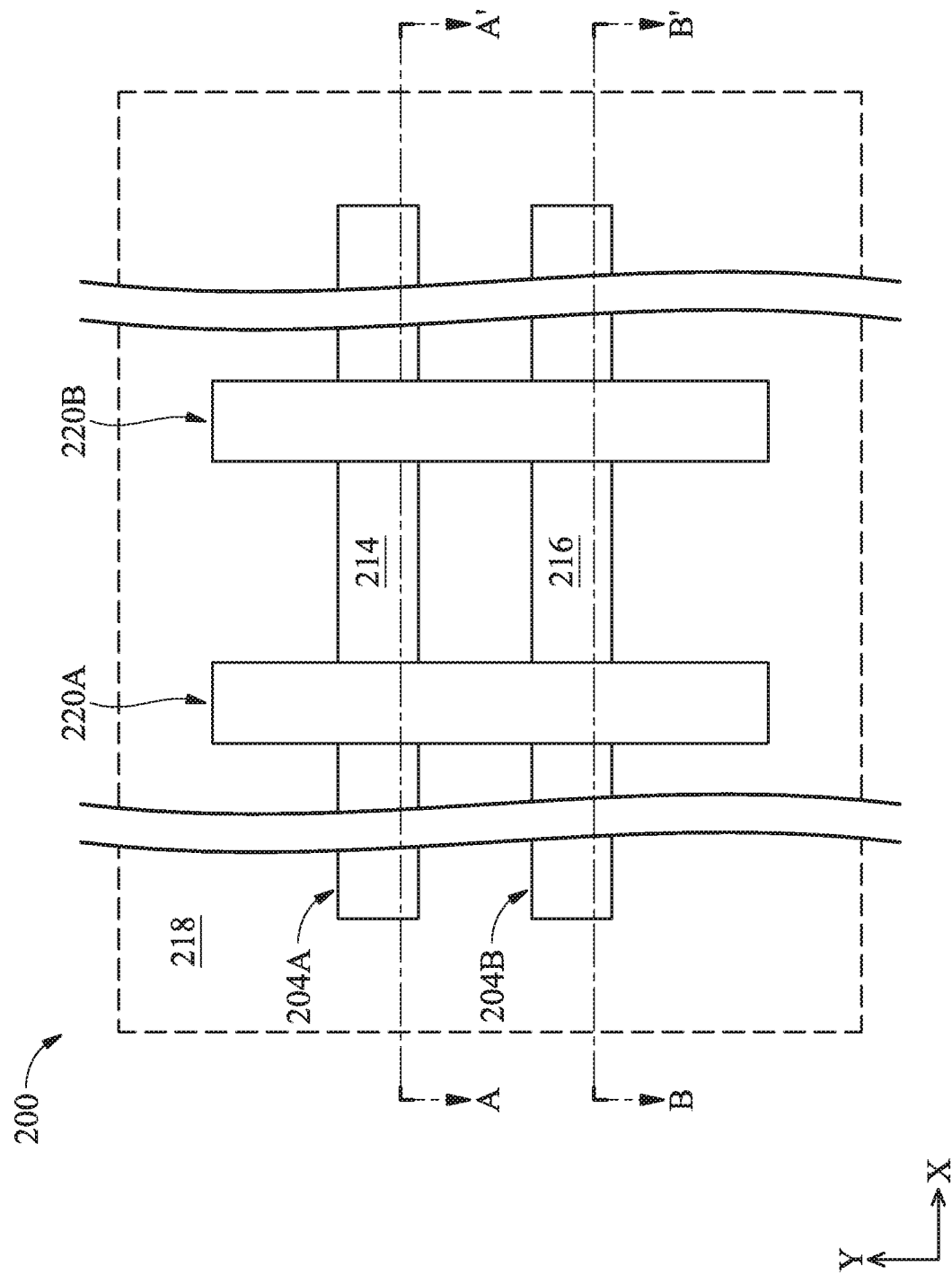
FIG. 2 is a top view of a workpiece according to various aspects of the present disclosure.

FIGS. 1A-1B illustrate a flowchart of the method 100 for processing a workpiece (also referred to as a semiconductor structure) 200 having various FETs. The method 100 is described in in reference to FIGS. 2 through 11; of which, FIG. 2 is a top view of the workpiece 200, and FIGS. 3-11 are cross-sectional views of the workpiece 200 (or a portion 230 thereof) taken along a dashed line AA' through a fin 204A and a dashed BB' through a fin 204B, respectively, at intermediate stages of the method 100, in accordance with some embodiments of the present disclosure. For illustrative purposes, a device region 210A including the cross-sectional view of the fin 204A and a device region 210B including the cross-sectional view of the fin 204B are depicted side-by-side in FIGS. 3-11. The method 100 is merely an example and thus does not limit the present disclosure to what is explicitly described therein. Additional steps can be provided before, during, and after the method 100, and some of the steps described can be replaced or eliminated for other embodiments of the method 100.

Figure 3:
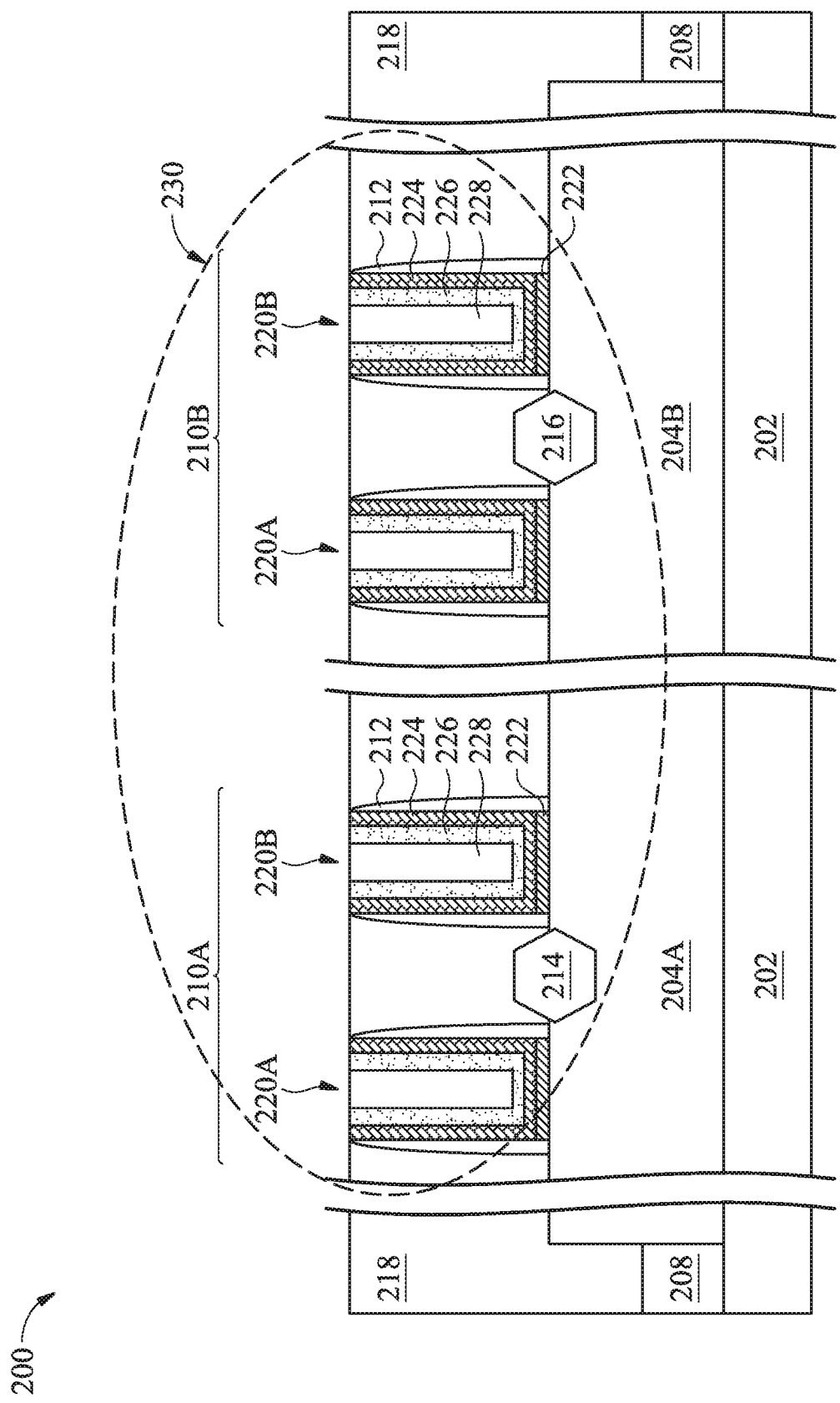
FIGS. 3, 4, 5, 6A, 7A, 8, 9, 10, and 11 are cross-sectional views of the workpiece of FIG. 2 taken along the dashed lines AA' and BB' at intermediate fabrication stages of a method according to various aspects of the present disclosure.

Referring first to block 102 of FIG. 1 and to FIGS. 2-3, the method 100 provides (or is provided with) the workpiece 200 that includes the fins 204A and 204B protruding out of a substrate 202 and oriented lengthwise along the X direction. A bottom portion of the fins 204A and 204B are separated by isolation features 208 disposed over the substrate 202. The workpiece 200 further includes metal gate structures 220A and 220B oriented lengthwise along the Y direction, forming various FETs with source/drain (S/D) features 214 and 216 disposed over the fins 204A and 204B, respectively. In the depicted embodiment, the workpiece 200 further includes an interlayer dielectric (ILD) layer 218 disposed over the isolation features 208, the fins 204A and 204B, and the S/D features 214 and 216. Although three-dimensional structures, or fins, are depicted as the active regions for forming various FinFETs, the present disclosure is not limited to such. For example, the fins 204A and 204B may be referred to as semiconductor layers 204A and 204B for forming planar FETs. The present disclosure will continue with the fins 204A and 204B as example active regions for illustrative purposes. Though not depicted herein, the workpiece 200 may include numerous features, such as a contact etch-stop layer (CESL) disposed over the isolation features 208, the fins 204A and 204B, the metal gate structure 220A and 220B, and the S/D features 214 and 216. The various features of the workpiece 200 are discussed in detail below.

The substrate 202 may include an elementary (single element) semiconductor, such as silicon in a crystalline structure and/or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; or combinations thereof. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The device region 210A including the fin 204A may be suitable for form forming an n-type FinFET, and the device region 210B including the fin 204B may be suitable for forming a p-type FinFET. This configuration is for illustrative purposes only and thus does not limit the present disclosure. The fins 204A and 204B may be fabricated using suitable processes including photolithography and etch processes. The photolithography process may include forming a photoresist layer (resist; not shown) overlying the substrate 202, exposing the resist to a pattern, performing post-exposure bake processes, and developing the resist to form a masking element (not shown) including the resist. The masking element is then used for etching recesses into the substrate 202, leaving the fins 204A and 204B on the substrate 202. The etching process may include dry etching, wet etching, reactive ion etching (RIE), and/or other suitable processes.

Numerous other embodiments of methods for forming the fins 204A and 204B may be suitable. For example, the fins 204A and 204B may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation features 208 may include silicon oxide, silicon nitride, silicon oxynitride, fluoride-doped silicate glass (FSG), a low-k dielectric material, and/or other suitable insulating material. The isolation features 208 may be shallow trench isolation (STI) features. In one embodiment, the isolation features 208 are formed by etching trenches in the substrate 202 during the formation of the fins 204A and 204B. The trenches may then be filled with an isolating material described above, followed by a chemical mechanical planarization (CMP) process. Other isolation structure such as field oxide, LOCal oxidation of silicon (LOCOS), and/or other suitable structures may also be implemented as the isolation features 208. The isolation features 208 may include a multi-layer structure, for example, having one or more thermal oxide liner layers.

The S/D features 214 and 216 are disposed in the fins 204A and 204B, respectively, each being adjacent the metal gate structures 220A and 220B. Though only one S/D feature 214 and one S/D feature 216 are depicted, multiple S/D features 214 may be provided adjacent the metal gate structures 220A and 220B in the device region 210A and multiple S/D features 216 may be provided adjacent the metal gate structures 220A and 220B in the device region 210B. Each of the S/D features 214 and 216 may be suitable for a p-type FinFET device (e.g., a p-conductivity type epitaxial material) or alternatively, an n-type FinFET device (e.g., an n-conductivity type epitaxial material). Throughout the present disclosure, "p-type" refers to a semiconductor material, such as silicon germanium, doped with a p-type dopant such as boron, indium, other p-type dopants, or combinations thereof, and "n-type" refers to a semiconductor material, such as silicon or silicon carbon, doped with an n-type dopant such as phosphorous, arsenic, other n-type dopants, or combinations thereof.

In the depicted embodiment, the S/D feature 214 is suitable for forming an n-type FinFET device and the S/D feature 216 is suitable for forming a p-type FinFET device. The n-type epitaxial material may include one or more epitaxial layers of silicon (epi Si) or silicon carbon (epi SiC), where the silicon or silicon carbon is doped with an n-type dopant as discussed above. The p-type epitaxial material may include one or more epitaxial layers of a semiconductor material such as silicon germanium (epi SiGe), silicon germanium carbon (epi SiGeC), germanium (epi Ge), where the semiconductor material is doped with a p-type dopant as discussed above. Though the S/D features 214 and 216 are depicted to have a hexagonal shape, embodiments of the present disclosure are not thus limited. For example, the S/D features 214 and 216 may adopt other geometric shapes such as a diamond shape.

The S/D features 214 and 216 may be formed by any suitable techniques, such as etching processes followed by one or more epitaxy processes. In one example, one or more etching processes are performed to remove portions of the fins 204A and 204B to form recesses (not shown) therein, respectively. A cleaning process may be performed to clean the recesses with a hydrofluoric acid (HF) solution or other suitable solution. Subsequently, one or more epitaxial growth (e.g., doping) processes, such as an in-situ doping process, an ion implantation process, a diffusion process, other processes, or combinations thereof, may be performed to form epitaxial features in the recesses. In some embodiments, a selective epitaxial growth (SEG) process, which is an in-situ doping process, is performed to grow the epitaxial material to which dopants (e.g., phosphorous for an n-type epitaxial material or boron for a p-type epitaxial material) are introduced into the semiconductor material (e.g., Si or SiGe) during the SEG process (e.g., by adding dopants to a source material of the SEG process). The SEG process can be implemented by any deposition technique, such as CVD, PVD, ALD, HDP-CVD, MO-CVD, RP-CVD, PE-CVD, low-pressure CVD (LP-CVD), atomic layer CVD (AL-CVD), atmospheric pressure CVD (AP-CVD), vapor-phase epitaxy (VPE), ultra-high vacuum CVD (UHV-CVD), molecular beam epitaxy, other suitable processes, or combinations thereof. The SEG process is implemented by introducing gaseous precursors and/or liquid precursors to S/D regions of the fins 204A or 204B to form S/D features 214 and 216, respectively. In some embodiments, a patterned mask may be used to facilitate the SEG process. In the depicted embodiment, forming the S/D feature 214 includes introducing a Si-containing precursor gas, such as $SiH_4$, with a phosphorous (P)-containing gas, such as $PH_3$. In furtherance to the depicted embodiment, forming the S/D feature 216 includes introducing a silicon-containing precursor gas, such as $SiH_4$ and/or a germanium-containing precursor gas, such as $GeH_4$, with a dopant-containing gas, such as $B_2H_6$. One or more annealing processes may be performed to activate the epitaxial materials. The annealing processes include rapid thermal annealing (RTA), laser annealing, other suitable annealing processes, or combinations thereof.

As a result, in the depicted embodiment, the S/D feature 214 includes one or more layers of phosphorus-doped silicon (SiP), and the S/D feature 216 includes one or more layers of boron-doped silicon germanium (SiGeB). In some embodiments, an amount of germanium in SiGeB ranges from about 10% (e.g., atomic percent) to about 50%. In the depicted embodiment, in order to meet desired device performance, the S/D features 214 and 216 may each be formed to a total thickness of about 35 nm to about 60 nm, though the present disclosure is not limited to this range of thickness.

The S/D feature 214 may be formed by an in-situ doping process as discussed above at a growth temperature of about 600 degrees Celsius to about 800 degrees Celsius (e.g., by heating the workpiece 200 to a temperature of about 600 degrees Celsius to about 800 degrees Celsius). The resulting S/D feature 214 may be a single-layer structure or a multi-layer structure with each layer including the same epitaxial material SiP but different dopant concentrations (i.e., different concentrations of P). In one non-limiting example, the S/D feature 214 includes three epitaxial layers of SiP, each having a different concentration of P ranging from about $2 \times 10^{20}$ cm$^{-3}$ to about $3 \times 10^{21}$ cm$^{-3}$. Of which, the topmost epitaxial layer of the S/D feature 214 includes a lower concentration of P than the bottommost epitaxial layer formed directly over the fin 204A, which has a lower concentration of P than the middle epitaxial layer. Of course, the S/D feature 214 is not limited to three layers and the relative concentrations of the dopant P may be different from those illustrated herein.

In some embodiments, the workpiece 200 further includes a SiGe layer (doped or undoped; not shown) having a thickness of about 1 nm to about 10 nm disposed over the S/D feature 216, where an amount of Ge in the SiGe layer is greater than that of Ge in the SiGeB of the S/D feature 216. In one example, the amount of Ge in the SiGe layer is greater than about 50% and less than about 90%. Alternatively, the workpiece 200 may include a pure Ge layer (i.e., Ge content being greater than about 99%; not shown) having a thickness of about 1 nm to about 10 nm disposed over the S/D feature 216. In many embodiments, having an additional SiGe or pure Ge layer disposed over the S/D features 216 increases the amount of Ge present in the device region 210B, which may be suitable for accommodating the subsequent processing steps of the method 100 discussed in detail below. In this regard, the SiGe layer and/or the pure Ge layer serve as sacrificial layers and may therefore be formed to a thickness much less than that of the S/D feature 216 (e.g., which is about 35 nm to about 40 nm).

The metal gate structures 220A and 220B each includes an interfacial layer 222, a gate dielectric layer 224, a work function metal layer 226, and bulk conductive layer 228. The interfacial layer 222 may include silicon oxide ($SiO_2$), silicon oxynitride (SiON), germanium oxide ($GeO_2$), other suitable materials, or combinations thereof. The interfacial layer 222 may be formed over the fins 204A and 204B by any suitable method, such as chemical oxidation, thermal oxidation, or deposition by chemical vapor deposition (CVD) or atomic layer deposition (ALD), other suitable methods, or combinations thereof. In some embodiments, the interfacial layer 222 may be omitted.

The gate dielectric layer 224 may include silicon oxide ($SiO_2$), silicon oxynitride (SiON), aluminum silicon oxide (AlSiO), a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. In the depicted embodiment, the gate dielectric layer 224 includes a high-k dielectric material, which is a dielectric material having a dielectric constant greater than that of silicon oxide. The gate dielectric layer 224 may be deposited by chemical oxidation, thermal oxidation, CVD, ALD, or other suitable methods.

The work function metal layer 226 may be a p-type or an n-type work function layer for the p-type FinFETs and n-type FinFETs, respectively. The p-type work function layer comprises a metal such as titanium nitride (TiN), tantalum nitride (TaN), ruthenium (Ru), molybdenum (Mo), tungsten (W), platinum (Pt), or combinations thereof. The n-type work function layer comprises a metal such as titanium (Ti), aluminum (Al), tantalum carbide (TaC), tantalum carbide nitride (TaCN), tantalum silicon nitride (TaSiN), or combinations thereof. In some embodiments, the metal gate structures 220A and 220B each includes more than one work function metal layers that may be of similar or different types. The bulk conductive layer 228 may include aluminum (Al), tungsten (W), cobalt (Co), copper (Cu), ruthenium (Ru), and/or other suitable materials. Though not depicted, the metal gate structures 220A and 220B may each other suitable layers such as barrier layer(s) and capping layer(s).

In many embodiments, dummy gate structures (not shown) including the interfacial layer 222, a dummy gate electrode (comprising, for example, polysilicon) and, in some examples, a gate dielectric layer, are first formed in place of the metal gate structures 220A and 220B before forming the S/D features 214 and 216. Thereafter, at least portions of the dummy gate structures are replaced with the metal gate structures 220A and 220B as discussed above in a gate replacement process. To complete the gate replacement, the ILD layer 218 (and, in some examples, the CESL (not shown)) are first formed over the fins 204A and 204B, the S/D features 214 and 216, the dummy gate structures, and the isolation features 208. Then, the dummy gate electrode and gate dielectric layer may be completely removed and the metal gate structures 220A and 220B are formed in their place in a "high-k last" gate replacement process. Alternatively, the gate dielectric layer of the dummy gate structures remains and becomes the gate dielectric layer 224 after removing the dummy gate electrode, and various material layers of the metal gate structure 220A and 220B are formed over the gate dielectric layer 224 to complete a "high-k first" gate replacement process. Various material layers of the may be formed by any suitable deposition process, such as CVD, physical vapor deposition (PVD), ALD, plating, other suitable processes, or combinations thereof. Thereafter, one or more CMP processes may be performed to planarize a top surface of the metal gate structures 220A and 220B with a top surface of the ILD layer 218.

Furthermore, the workpiece 200 may include gate spacers 212 disposed along sidewalls of the metal gate structures 220A and 220B. The gate spacers 212 may include a dielectric material, such as silicon oxide, silicon nitride, silicon carbide, silicon oxynitride, and/or other suitable dielectric materials. The gate spacers 212 may be a single layered structure or a multi-layered structure. The gate spacers 212 may be formed after forming the dummy gate structures but before forming the S/D features 214 and 216 by first depositing a blanket of spacer material over the workpiece 200, and then performing an anisotropic etching process to remove portions of the spacer material to form the gate spacers 212 along sidewalls of the dummy gate structures. The gate spacers 212 remain as a portion of the workpiece 200 during the gate replacement process as discussed above.

For embodiments in which the workpiece 200 includes a CESL, the CESL may include silicon nitride, silicon oxynitride, silicon carbon oxynitride, and/or other suitable materials, and may be formed by CVD, PVD, ALD, other suitable methods, or combinations thereof. The ILD layer 218 may include a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 218 may include a multi-layer structure having multiple dielectric materials. The ILD layer 218 may be formed prior to the gate replacement process as discussed above by a deposition process such as, for example, CVD, PVD, flowable CVD (FCVD), spin-on glass (SOG), other suitable processes, or combinations thereof. Subsequent to forming the ILD layer 218, a planarization process such as CMP may be performed such that a top portion of the dummy gate structures are exposed, allowing the gate replacement process discussed above to be completed.

Figure 4:
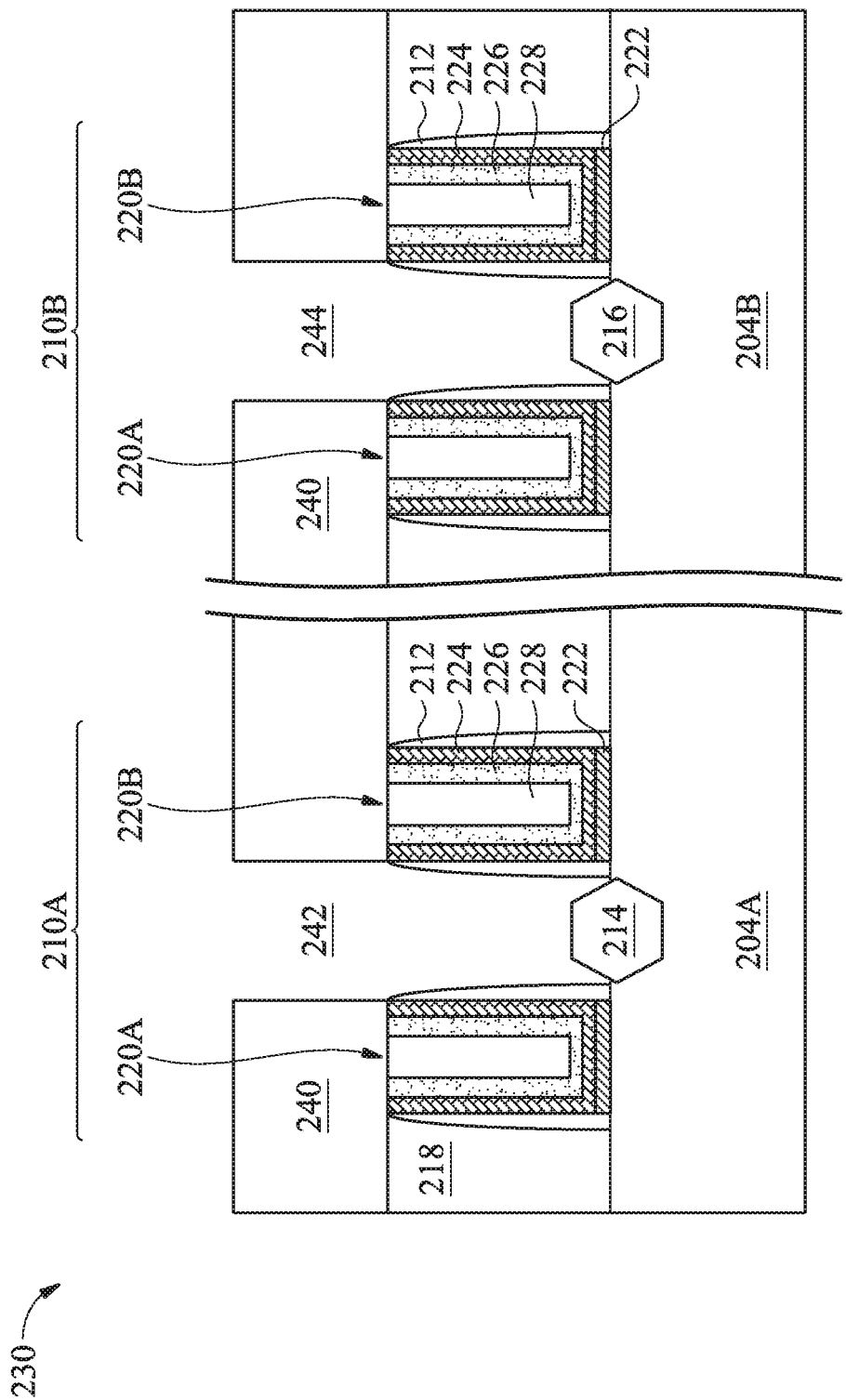

Referring now to block 104 of FIG. 1A and to FIG. 4, the method 100 forms a trench 242 over the S/D feature 214 in the device region 210A and a trench 244 over the S/D feature 216 over the S/D feature 216 in the device region 210B. For purposes of simplicity, the following descriptions are provided in reference to a portion 230 of the workpiece 200 as denoted in FIG. 3. To form the trenches 242 and 244, the method 100 first forms an ILD layer 240 similar to the ILD layer 218 described above over the workpiece 200 (or the portion 230). Thereafter, the method 100 patterns and etches the ILD layers 240 and 218 to form the trenches 242 and 244. Specifically, the method 100 may first form a masking element (not shown) over the workpiece 200 that includes a resist (e.g., photoresist) layer, a hard mask layer, and/or a bottom layer (e.g., bottom anti-reflective coating). The method 100 then proceeds to pattern the resist layer, thereby forming openings (not shown) in the masking element. The ILD layers 240 and 218 are then etched using the patterned resist layer as an etch mask to form the trenches 242 and 244 that expose the S/D features 214 and 216, respectively. The etching of the ILD layers 240 and 218 may be performed by any suitable process including dry etching, wet etching, RIE, other suitable processes, or combinations thereof. The masking element is subsequently removed by any suitable method such as resist stripping or plasma ashing.

Figure 5:
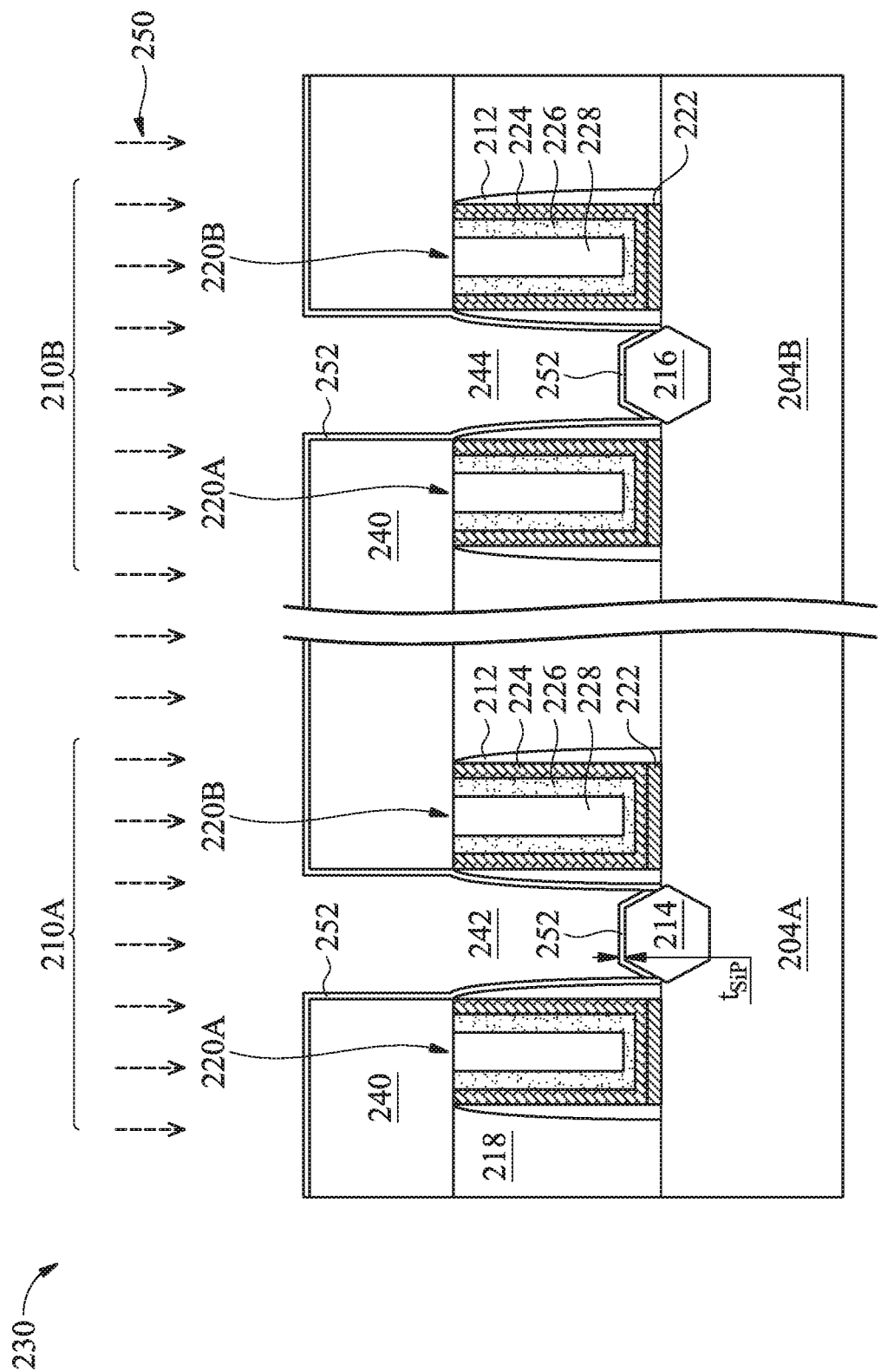

Referring to block 106 of FIG. 1A and to FIG. 5, the method 100 forms an n-type semiconductor layer 252 in the trenches 242 and 244 and over a top surface of the ILD layer 240. Notably, the n-type semiconductor layer 252 is deposited over the epitaxial crystalline material of the S/D features 214 and 216 as well as dielectric features such as the ILD layer 240 and the gate spacers 212. The portions of the n-type semiconductor layer 252 formed over the S/D features 214 and 216 is crystalline and epitaxially grown, which is similar in composition to the epitaxial material included in the S/D features 214, while the portions of the n-type semiconductor layer 252 formed over the dielectric features (e.g., the ILD layer 240, the gate spacers 212, etc.) is amorphous. As will be discussed below, the crystalline portions of the n-type semiconductor layer 252 will remain disposed over the S/D features 214 and 216 and the amorphous portions of the n-type semiconductor layer 252 will be selectively removed from the dielectric features in a subsequent etching process.

The n-type semiconductor layer 252 may include any suitable n-type semiconductor material, such as, for example, silicon doped with phosphorous (SiP), silicon doped with arsenic (SiAs), silicon carbon doped with phosphorous (SiPC), silicon carbon doped with arsenic (SiAsC), other n-type semiconductor materials, or combinations thereof. Accordingly, though the following disclosure will refer to the n-type semiconductor layer 252 as SiP layer 252, it is only an example embodiment and thus does not limit the n-type semiconductor layer 252 to only include SiP. In many embodiments, the method 100 forms the SiP layer 252 by depositing a gaseous mixture 250 that includes a Si-containing gas, such as $SiH_4$, and a P-containing gas, such as $PH_3$, at a temperature of about 300 degrees Celsius to about 500 degrees Celsius (e.g., by heating the workpiece 200 to a temperature of about 300 degrees Celsius to about 500 degrees Celsius). In an example embodiment, the concentration of P in the SiP layer 252 is about $2 \times 10^{21}$ cm$^{-3}$.

In contrast, the epitaxial SiP of the S/D feature 214 is formed at a much higher temperature (e.g., from about 600 degrees Celsius to about 800 degrees Celsius as discussed above) than the crystalline portions of the SiP layer 252 as discussed above. Additionally, when compared at a similar doping level (i.e., having similar concentrations of P), the crystalline portions of the SiP layer 252 have a resistivity that is less than about ½ of the resistivity of the epitaxial SiP of the S/D feature 214. As illustrative examples, the resistivity of the S/D feature 214 may be about 0.6 mΩ·cm (milliOhm·cm) to about 0.8 mΩ·cm, and the resistivity of the SiP layer 252 may be about 0.2 mΩ·cm to about 0.4 mΩ·cm. Such reduction in resistivity may be attributed to a lower concentration of point defects present in the SiP layer 252 due to a lower processing temperature than its counterpart in the S/D feature 214 formed at a higher processing temperature. In this regard, the processing temperature for forming the SiP layer 252 may be controlled from about 300 degrees Celsius to about 500 degrees Celsius in order reduce the resistivity of SiP in comparison to the SiP of the S/D feature 214. On one hand, if the processing temperature is lower than about 300 degrees Celsius, the growth of SiP may be amorphous or polycrystalline, rather than single crystalline, which results in a lower resistivity than its amorphous or polycrystalline counterparts. Additionally, when the processing temperature is lower than about 300 degrees Celsius, the growth rate of SiP is also reduced, prolonging the processing time. Furthermore, at lower processing temperature, higher-order silane precursors, such as $Si_4H_{10}$ and $Si_5H_{12}$, may be needed, potentially increasing the cost associated with the fabrication processes. On the other hand, if the processing temperature is higher than about 500 degrees Celsius, components of the metal gate structures 220A and 220B may be subjected to undesired thermal damage. In the present disclosure, lowering the resistivity of the SiP layer 252 formed over the S/D feature 214 serves to reduce a contact resistance at an interface between the S/D features 214 and a subsequently formed S/D contact 294 (see FIG. 11) over the S/D feature 214, thereby improving the performance of the FinFETs formed in the workpiece 200.

In many embodiments, the SiP layer 252 is formed to a thickness $t_{SiP}$ of about 0.5 nm to about 1.5 nm. As will be discussed below, because a subsequent processing step may remove a portion of the SiP layer 252, if the $t_{SiP}$ is less than about 0.5 nm, not enough SiP would remain in the workpiece 200 to effect a reduction in the contact resistance between the S/D feature 214 and the S/D contact 294. If, however, the $t_{SiP}$ is greater than about 1.5 nm, portions of the semiconductor material layer formed over the dielectric features (e.g., the ILD layer 240 and the gate spacers 212) may become too thick to be removed in the subsequent etching process.

Figure 6A:
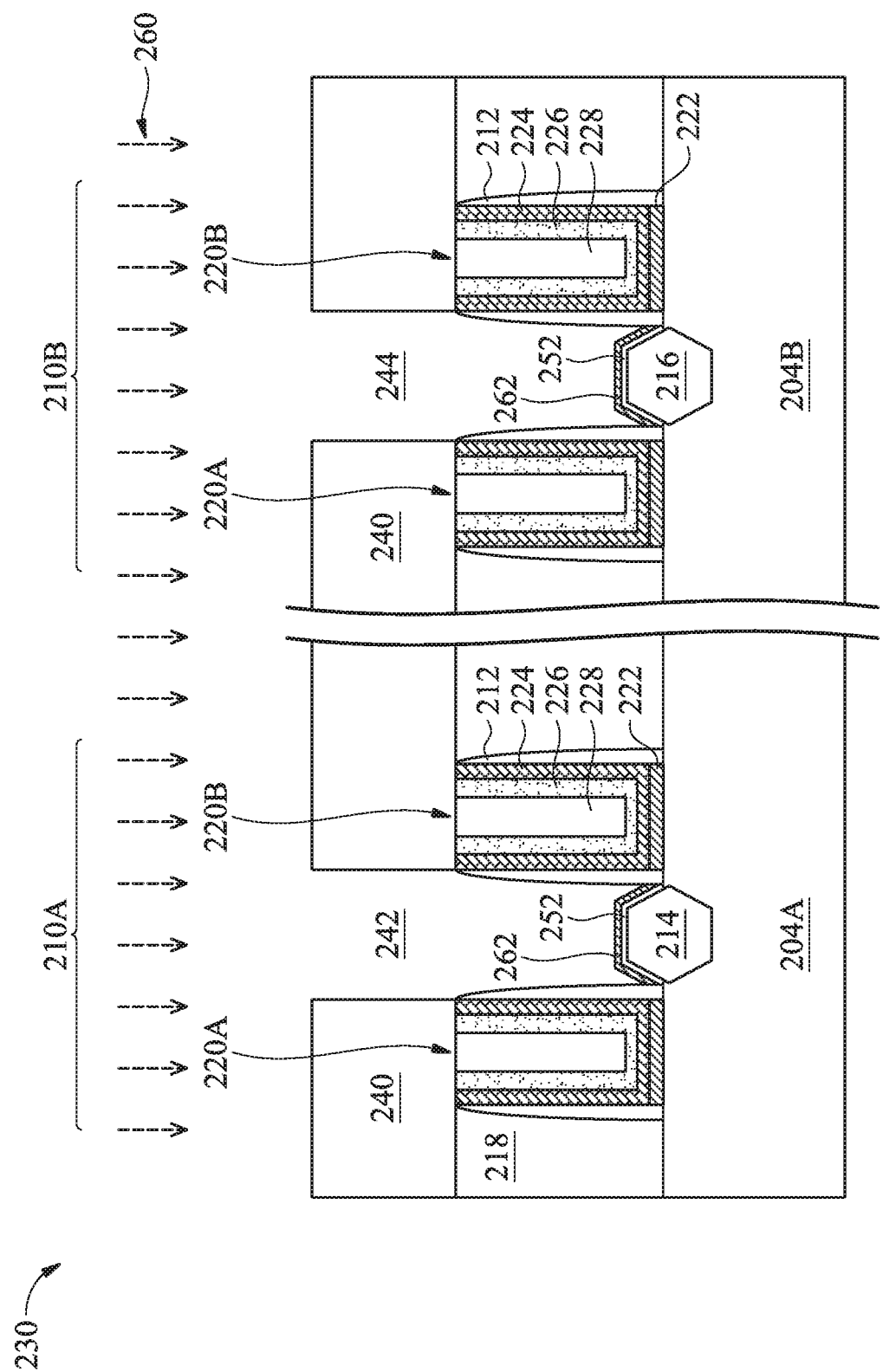

Referring to block 108 of FIG. 1A and to FIG. 6A, the method 100 performs a treatment to the workpiece 200, thereby forming a Ge-containing layer 262 over the crystalline portions of the SiP layer 252 in the trenches 242 and 244. The method 100 first implements a gaseous mixture 260 that includes a Ge-containing gas, such as $GeH_4$, and a chlorine (Cl)-containing gas, such as HCl, $Cl_2$, other suitable Cl-containing gases, or combinations thereof to the workpiece 200. In the present disclosure, the Ge-containing gas forms a Ge-containing layer 262 over the crystalline portions of the SiP layer 252, while the amorphous portions of the SiP layer 252 are removed by the Cl-containing gas. Details of the treatment are discussed below.

In many embodiments, the Ge-containing gas deposits Ge atoms over both the crystalline and amorphous portions of the SiP layer 252, dynamically forming Si—Ge bonds globally over the top surface of SiP layer 252. Ge atoms diffuse into the amorphous portions of the SiP layer 252 at a greater rate than the crystalline portions of the SiP layer 252 and forms an amorphous Ge-containing SiP layer. In comparison, Ge atoms have limited diffusion into the crystalline portions of the SiP layer 252 and form the Ge-containing layer 262 (i.e., a pure Ge residual layer with a Ge concentration of about 100%) thereover. Because the energy of the Ge—Si bond is less than the covalent Si—Si bond, etching selectivity of the amorphous Ge-containing SiP layer by the Cl-containing gas is enhanced relative to other components of the workpiece 200. In other words, the amorphous portions of the SiP layer 252 is etched at a greater rate than the crystalline portions of the SiP layer 252, which is not etched or only minimally etched. As a result, the Ge-containing layer 262 remains over the crystalline portions of the SiP layer 252. In some embodiments, the Ge-containing layer 262 has a thickness of about 0.5 nm to about 2 nm when formed using the methods provided herein. In some embodiments, the Cl-containing gas is omitted from the gaseous mixture 260 and only the Ge-containing gas is used to treat the workpiece 200. As such, the amorphous portions of the SiP layer 252 formed over the dielectric features may be removed at a subsequent etching process.

A ratio of partial pressure of the Cl-containing gas to the Ge-containing gas may be tuned to control the removal of the amorphous portions of the SiP layer 252 and the formation of the Ge-containing layer 262. If the ratio is too small, i.e., if the partial pressure of Ge-containing gas is significantly greater than the partial pressure of the Cl-containing gas, excessive pile up of the Ge-containing layer 262 would occur over the crystalline portions of the SiP layer 252, making it difficult to be removed at a subsequent fabrication step. On the other hand, if the ratio is too large, i.e., if the partial pressure of Cl-containing gas is significantly greater than the partial pressure of Ge-containing gas, the etching rate of the amorphous portions of the SiP layer 252 would be reduced significantly. In an example embodiment, the ratio is from about 22 to about 100.

In the device region 210B, because a concentration gradient of Ge exists between the Ge-containing layer 262 and the SiP layer 252 and between the S/D feature 216 and the SiP layer 252, Ge atoms diffuse from the top and from the bottom to the SiP layer 252, thereby transforming it into a SiPGe layer 254. Similarly, though to a much lesser degree, a concentration gradient of Ge between the Ge-containing layer 262 and the SiP layer 252 drives diffusion of Ge atoms into the SiP layer 252 in the device region 210A. As such, the concentration of Ge in the SiPGe layer 254 is greater than the concentration of Ge in the SiP layer 252. In some embodiments, a thickness of the SiPGe layer 254 is less than a thickness of the Ge-containing layer 262. For example, a ratio of a thickness of the SiPGe layer 254 to the Ge-containing layer 262 is about 0.5 to about 1.0, although the present disclosure is not limited as such. FIG. 6B illustrates an example embodiment of the diffusion of Ge from the Ge-containing layer 262 and the S/D feature 216 to the SiPGe layer 254, where the arrows indicate the direction of Ge diffusion. Notably, once diffusion equilibrium is reached between the three layers, an amount of Ge in the SiPGe layer 254 is at least 10% (wt %) to allow for a desired etching selectivity in the subsequent fabrication step.

Figure 6C:
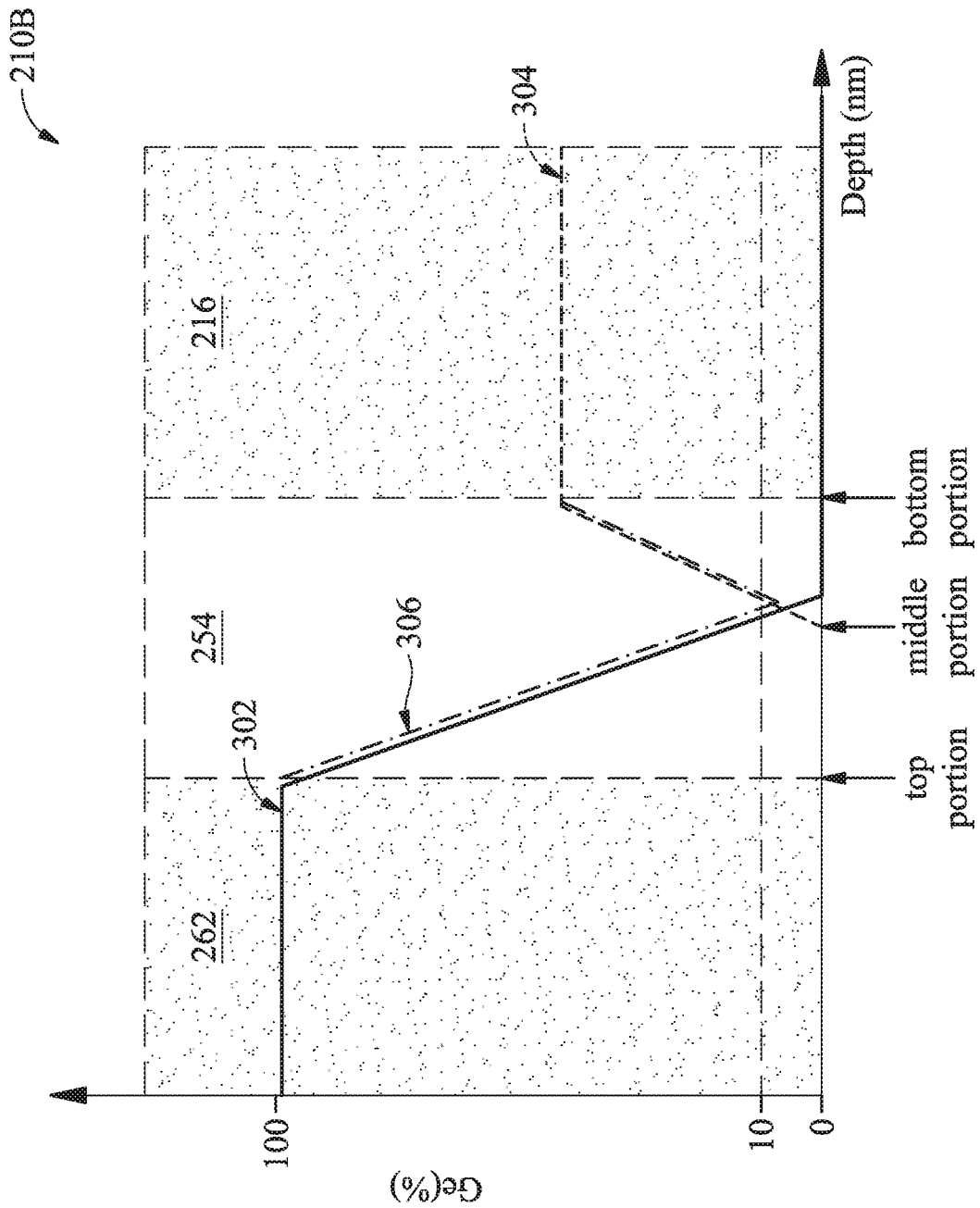
FIGS. 6C and 6D illustrate concentration profiles of a portion of the workpiece of FIG. 6A during an intermediate fabrication stage of a method according to various aspects of the present disclosure.
Figure 6D:
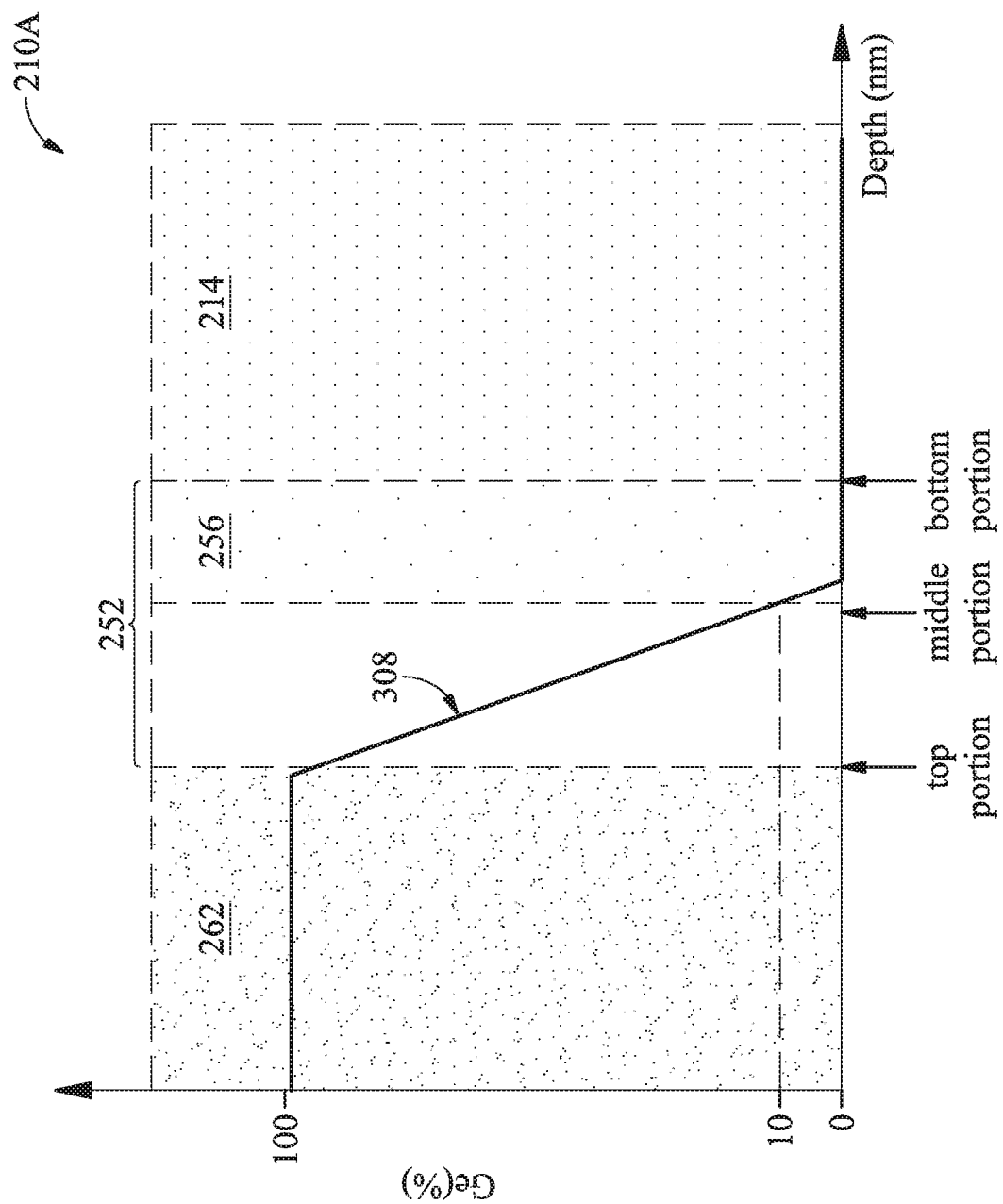

In an example embodiment, referring to FIG. 6C, an example concentration profile 304 of Ge in the SiPGe layer 254 varies throughout its thickness in the device region 210B. In the depicted example, the Ge-containing layer 262 includes about 100% of Ge and the S/D feature 216 includes about 50% of Ge; of course, the present disclosure is not limited to these compositions so long as the amount of Ge is greater in the Ge-containing layer 262 than the S/D feature 216. The intersection between Ge profile 302 due to the diffusion of Ge from the Ge-containing layer 262 to the SiPGe layer 254 and Ge profile 304 due to the diffusion of Ge from the S/D feature 216 to the SiPGe layer 254 forms the concentration profile 306 of the SiPGe layer 254. Specifically, a top portion of the SiPGe layer 254 includes the highest amount of Ge owing to its proximity to the Ge-containing layer 262. A bottom portion of the SiPGe layer 254 includes less Ge than the top portion but more Ge than a middle portion of the SiPGe layer 254 due to the diffusion of Ge from the S/D feature 216. Referring to FIG. 6D, which depicts an example concentration profile 308 of Ge in the SiP layer 252 in the device region 210A. Notably, although a top portion of the SiP layer 252 includes a limited amount of Ge due to the diffusion of Ge from the Ge-containing layer 262, the concentration is depleted in a bottom portion of the SiP layer 252 near the S/D feature 214. In fact, the SiP layer 252 includes a Ge-free or substantially Ge-free region 256 (hereafter referred to as SiP layer 256) containing less than about 10% Ge. As will be discussed in detail below, only regions including greater than about 10% Ge would be removed due to a selective etching process utilizing one or more Cl-containing gas.

Figure 7A:
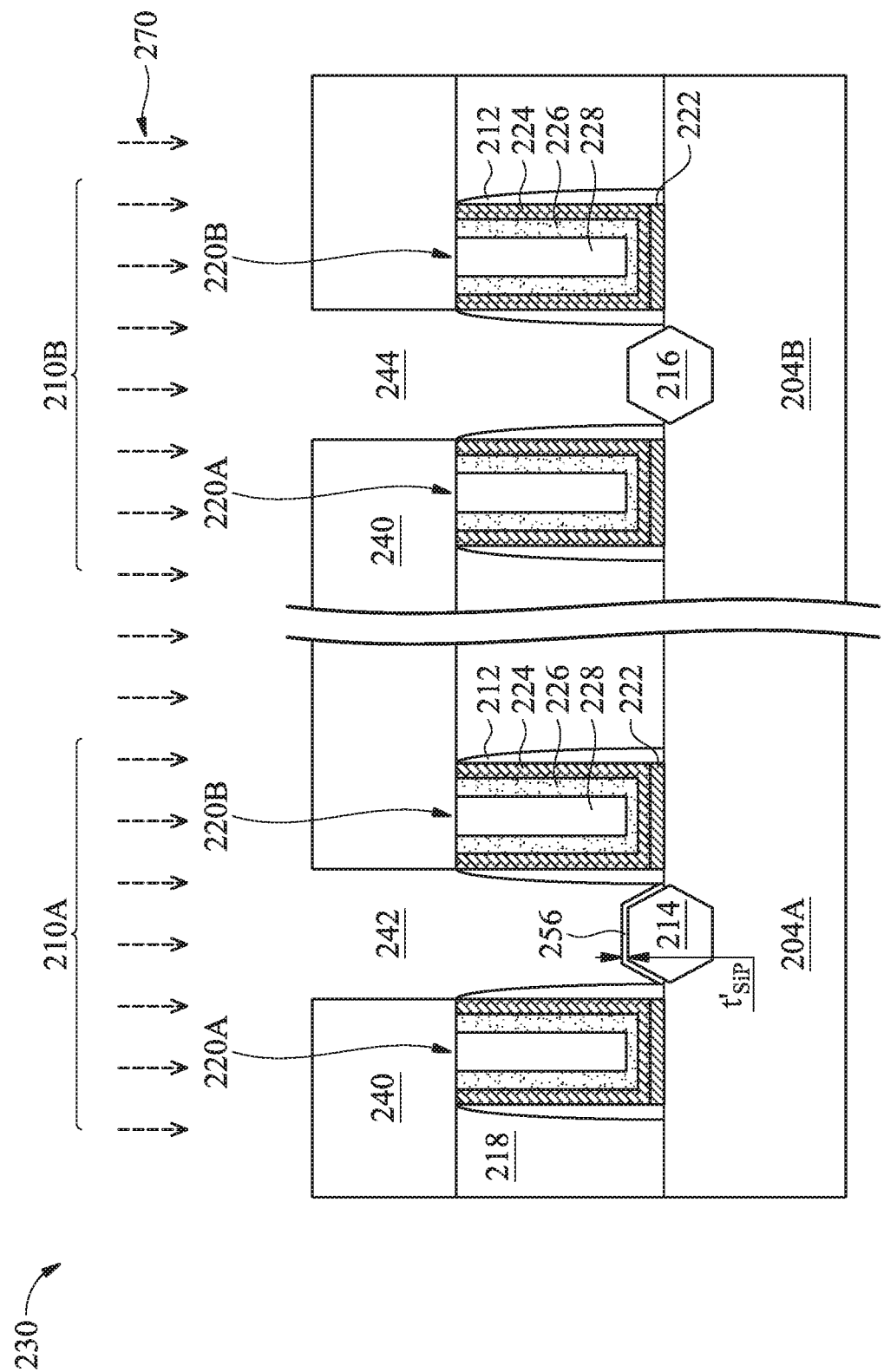

Referring to block 110 of FIG. 1B and to FIG. 7A, the method 100 etches the Ge-containing layer 262 from both the device regions 210A and 210B as well as the SiPGe layer 254 in the device region 210B and a portion of the SiP layer 252 in the device region 210A. The method 100 implements a dry etching process that utilizes a Cl-containing gas 270, similar to the Cl-containing gas(es) included in the gaseous mixture 260 implemented at block 108, to remove the Ge-containing layer 262 and the SiPGe layer 254. In some examples, the Cl-containing gas 270 may be HCl, Cl$_2$, other Cl-containing gases, or combinations thereof. In many embodiments, the Cl-containing gas 270 selectively etches Ge at a higher rate than other components present in the workpiece 200. In other words, material layers that include Ge are etched at a higher rate than material layers that do not, and material layers that include a higher amount of Ge are etched at a higher rate than material layers that include less Ge by comparison. In the depicted embodiment, though the SiP layer 252 in the device region 210A includes a small amount of Ge diffused from the Ge-containing layer 262 (referring to concentration profile 308 in FIG. 6D), the SiPGe layer 254 includes a greater amount of Ge (at least 10% as discussed above) by comparison and is therefore etched at a higher rate than the SiP layer 252.

Figure 7B:
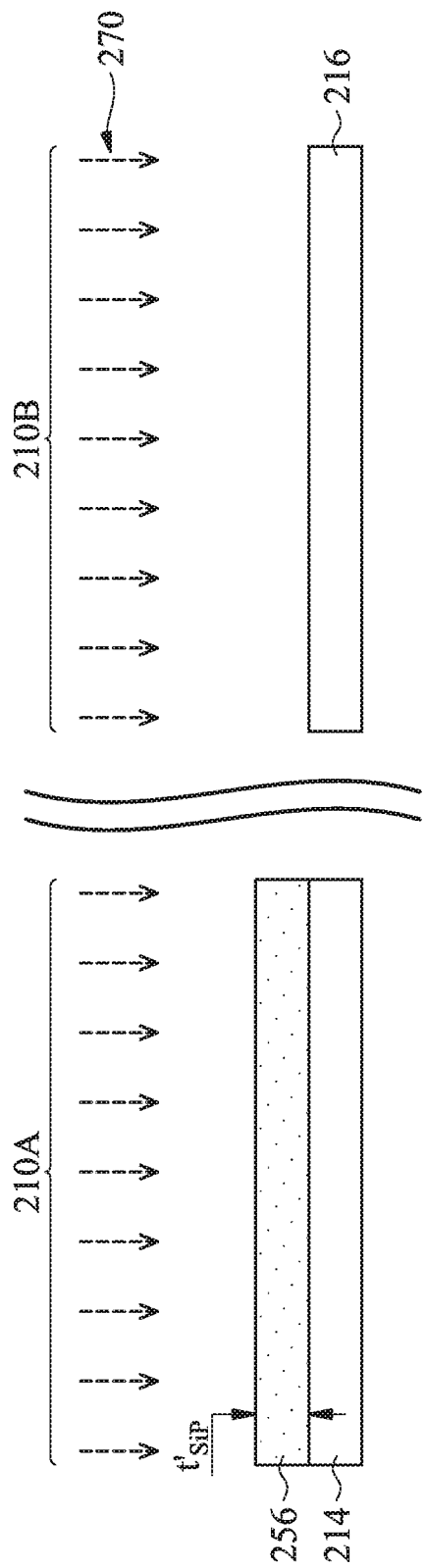
FIG. 7B illustrates a portion of the workpiece of FIG. 7A during an intermediate fabrication stage of a method according to various aspects of the present disclosure.

Accordingly, referring to FIG. 7B, which is an enlarged depiction of a portion of the workpiece 200 in FIG. 7A, the dry etching process at block 110 may completely remove the Ge-containing layer 262 and the SiPGe layer 254 from the device region 210B and partially remove the SiP layer 252 from the device region 210A to form an SiP layer 256. In some examples, up to about 75% of $t_{SiP}$ of the SiP layer 252 may be removed by the method 100 at block 110, such that a thickness $t'_{SiP}$ of the SiP layer 256 is at least about 25% of $t_{SiP}$. However, the present disclosure contemplates embodiments in which less thickness may be removed by the dry etching process. Accordingly, the dry etching process at block 110 exposes a top surface of the S/D feature 216 in the trench 244, while the SiP layer 256 is disposed over the S/D feature 214. For embodiments in which an additional SiGe layer or a pure Ge layer is formed over the S/D feature 216 before performing the method 100 at block 106, the etching process at block 110 may remove a portion of the additional SiGe layer or the pure Ge layer so as to prevent the S/D feature 216 from being consumed. As such, a thin layer (e.g., less than about 10 nm) of SiGe or pure Ge layer may remain over the S/D feature 216 following the etching process at block 110.

Figure 8:
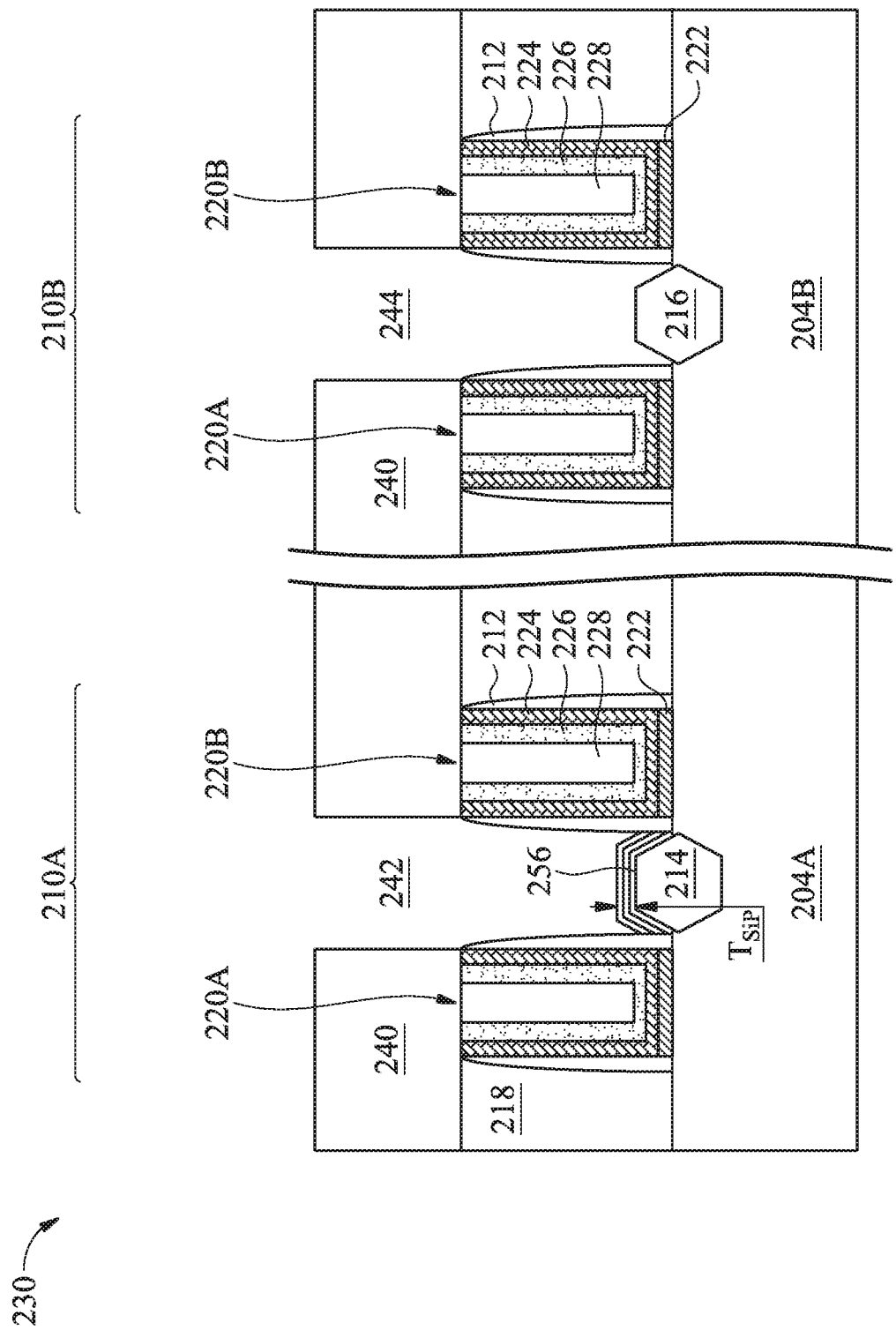

Referring now to FIGS. 1B and 8, the method 100 may repeat the cycle of processes at blocks 106, 108, and 110 to form multiple SiP layers 256 overlying each other in the device region 210A if a desired thickness $T_{SiP}$ of the multiple SiP layer 256 has not been achieved. If, however, the desired thickness $T_{SiP}$ has been achieved, the method proceeds to block 112. Depending upon desired design requirements, the desired thickness $T_{SiP}$ may be about 4 nm and about 6 nm. Because the deposition of each SiP layer 252 is implemented at elevated temperatures (from about 300 degrees Celsius to about 500 degrees Celsius), the number of cycles (which corresponds to the magnitude of $T_{SiP}$) may be limited by a thermal budget (i.e., tolerance) of the various material layers included in the metal gate structures 220A and 220B. Accordingly, the method 100 is configured to maximize the magnitude of $T_{SiP}$ within the range discussed herein without compromising the integrity of the metal gate structures 220A and 220B. For example, if the desired thickness $T_{SiP}$ exceeds about 6 nm, it is likely that the repetition of the cycle of processes at blocks 106, 108, and 110 may inadvertently damage the structure and performance of nearby device components (e.g., metal gate structures). On the other hand, if the desired thickness $T_{SiP}$ falls below about 4 nm, not enough SiP layers 252 are provided to reduce contact resistance between the S/D feature 214 and a subsequently formed S/D contact. Notably, due to the repeated removal of the Ge-containing layer 262 and the SiPGe layer 254 from the trench 244 as depicted and discussed with reference to FIGS. 6 and 7, no SiP layer remains over the S/D feature 216.

Figure 9:
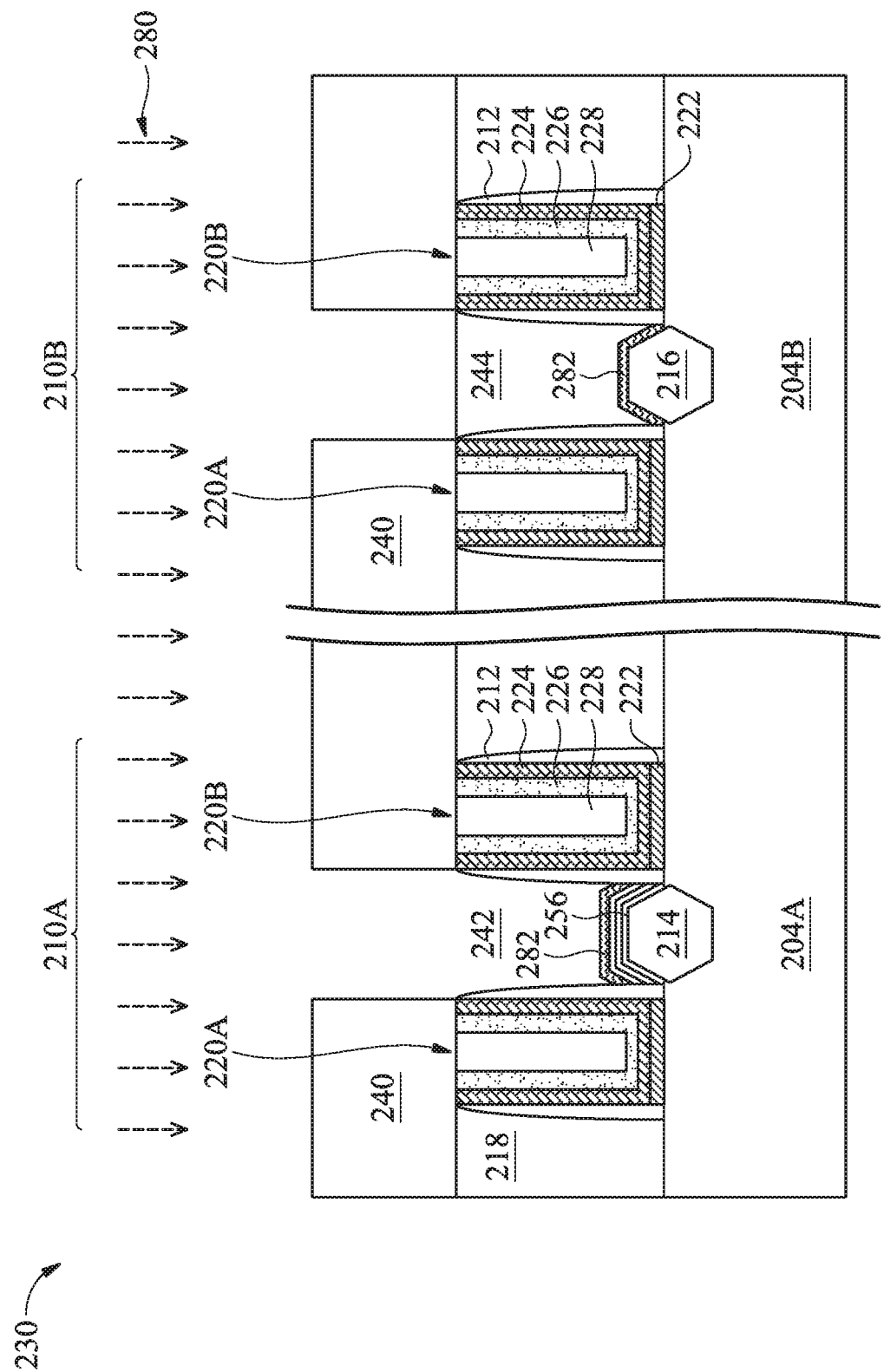

Referring now to block 112 of FIG. 1B and to FIG. 9, the method 100 forms a silicide layer 282 over the SiP layers 256 in the trench 242 and over the S/D feature 216 in the trench 244. In the depicted embodiment, the silicide layer 282 is disposed over the SiP layers 256 and the S/D feature 216. The silicide layer 282 may include nickel silicide, cobalt silicide, tungsten silicide, tantalum silicide, titanium silicide, platinum silicide, erbium silicide, palladium silicide, other suitable silicides, or combinations thereof. The silicide layer 282 may be formed by a series of processes. First, a metal layer 280 may be deposited over the SiP layers 256 and the S/D feature 216 by a deposition process such as CVD, ALD, PVD, other suitable processes, or combinations thereof. The metal layer may include nickel, cobalt, tungsten, tantalum, titanium, platinum, erbium, palladium, other suitable metals, or combinations thereof. Then, the workpiece 200 is annealed to allow the metal layer and the semiconductor materials of the SiP layer(s) 256 and the S/D feature 216 to react. Thereafter, the un-reacted metal layer is removed, leaving the silicide layer 282 over the SiP layers 256 and the S/D feature 216.

Figure 10:
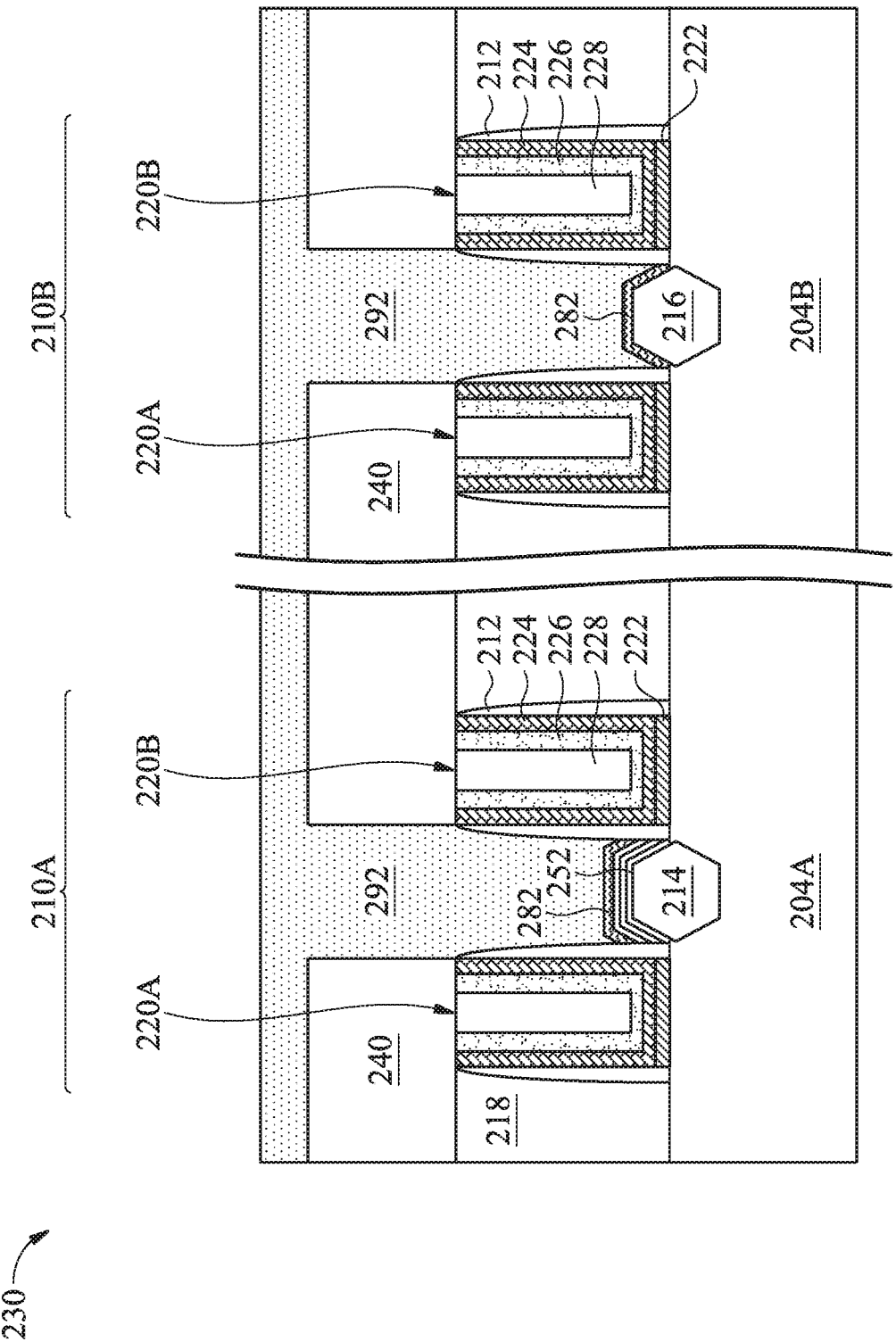
Figure 11:
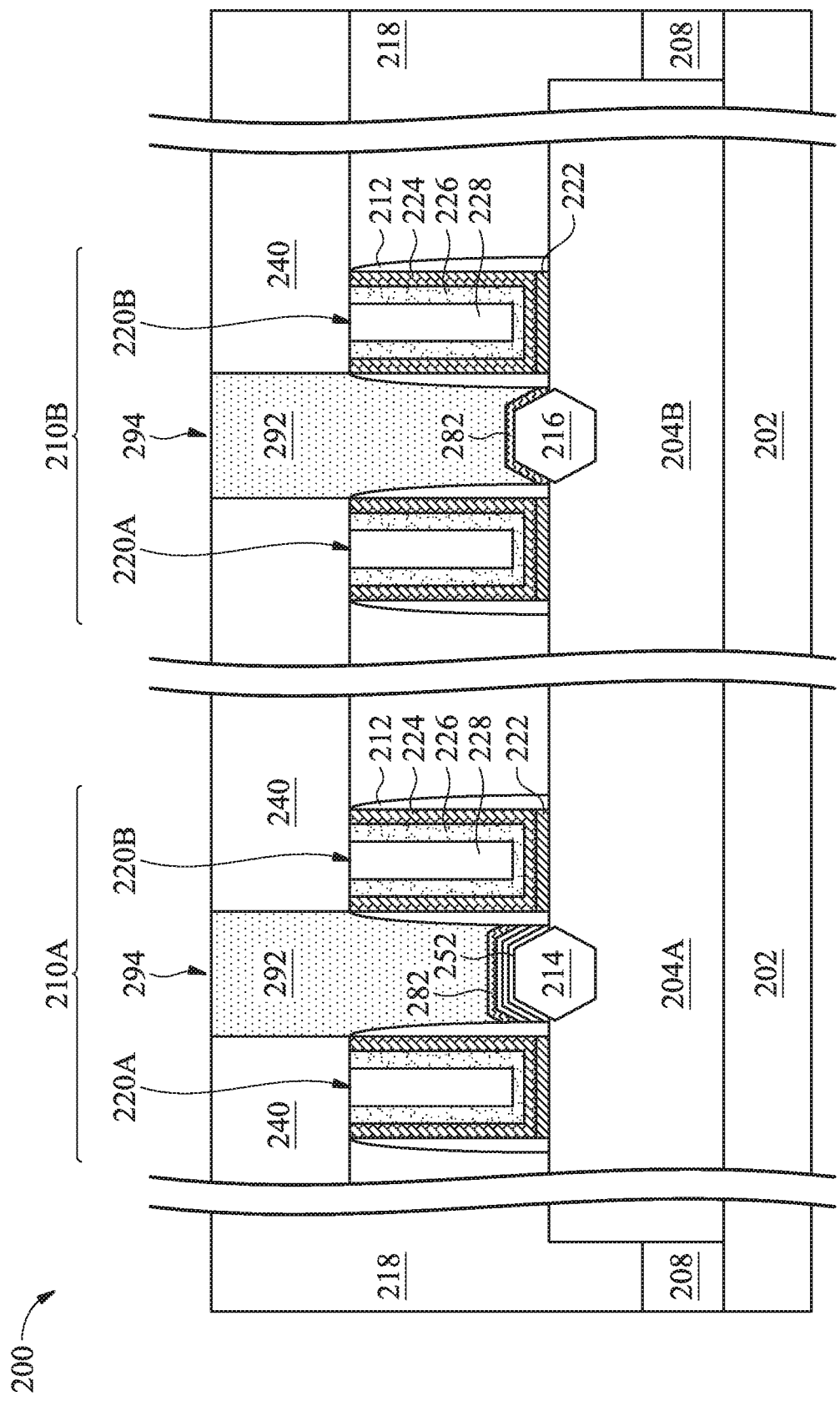

Referring to block 114 of FIG. 1B and to FIG. 10, the method 100 deposits a conductive material 292 in the trenches 242 and 244, such that the conductive material 292 is in contact with the ILD layer 240, the gate spacers 212, and the silicide layer 282. The conductive material 292 may include any suitable material such as copper (Cu), tungsten (W), cobalt (Co), ruthenium (Ru), aluminum (Al), other suitable conductive materials, or combinations thereof. Thereafter, referring to FIG. 11, which illustrates an example embodiment of the workpiece 200, the method 100 performs one or more CMP processes to remove excess conductive material 292 and form S/D contacts 294 in the device regions 210A and 210B. Notably, a bottom surface of the S/D contact 294 in the device region 210B is below a bottom surface of the S/D contact 294 in the device region 210A.

Referring to block 116, the method 100 performs additional processing steps to the workpiece 200. For example, the method 100 may proceed to form an interconnection structure to couple various devices to an integrated circuit. The interconnection structure includes metal lines in multiple metal layers for horizontal coupling and vias/contacts for vertical coupling between a bottom metal layer and the device features formed on the substrate 202 (such as S/D contacts connecting the metal gate structures 220A and 220B to a bottom metal layer), between a bottom metal layer and the S/D contacts 294, or between adjacent metal layers. The interconnect structure include one or more suitable conductive material, such as copper (Cu), cobalt (Co), ruthenium (Ru), aluminum (Al), tungsten (W), or other suitable conductive materials. The interconnection structure may be formed by damascene process, such as single damascene process or dual damascene process, which include, lithography patterning, etching deposition and CMP. For example, the conductive material can be deposited using suitable process, such as CVD, PVD, plating, and or other suitable processes. The illustrated workpiece 200 is merely an example of some embodiments of the method 100. The method 100 may include various other embodiments without departure from the scope of the present disclosure.

Furthermore, the workpiece 200 as shown above may be intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

The present disclosure provides a semiconductor structure and methods of making the same. An embodiment of the present disclosure includes selectively forming n-type epitaxial semiconductor layers including silicon and phosphorous (SiP) over NFET S/D features but not over the PFET S/D features. The n-type epitaxial semiconductor layers disclosed herein may be formed at a lower processing temperature, thereby reducing the resistivity of the SiP when compared to the S/D features formed at a higher processing temperature. Embodiments of the present disclosure offer various advantages, though no particular advantage is required for all embodiments. In at least some embodiments, by selectively forming the n-type epitaxial semiconductor layers using the disclosed methods, thermal damages, processing complexity, and production cost incurred during device fabrication processes may be reduced and the device performance may be enhanced.

In one aspect, the present disclosure provides a method that includes providing a p-type S/D epitaxial feature and an n-type source/drain (S/D) epitaxial feature, forming a semiconductor material layer over the n-type S/D epitaxial feature and the p-type S/D epitaxial feature, processing the semiconductor material layer with a germanium-containing gas, where the processing of the semiconductor material layer forms a germanium-containing layer over the semiconductor material layer, etching the germanium-containing layer, where the etching of the germanium-containing layer removes the germanium-containing layer formed over the n-type S/D epitaxial feature and the semiconductor material layer formed over the p-type S/D epitaxial feature, and forming a first S/D contact over the semiconductor material layer remaining over the n-type S/D epitaxial feature and a second S/D contact over the p-type S/D epitaxial feature. In some embodiments, the n-type source/drain (S/D) epitaxial feature is formed at a first temperature, and the semiconductor material layer is formed at a second temperature, where the second temperature is lower than the first temperature. In some embodiments, the method further includes, before the forming of the first and the second S/D contacts, forming a silicide layer over the semiconductor material layer remaining over the n-type S/D epitaxial feature and over the p-type S/D epitaxial feature, respectively.

In some embodiments, the semiconductor material layer has a composition similar to that of the n-type S/D epitaxial feature. In some embodiments, the semiconductor material layer has the same composition as the n-type S/D epitaxial feature. In some embodiments, the semiconductor material layer includes silicon and phosphorous. In further embodiments, a resistivity of the semiconductor material layer is lower than that of the n-type S/D epitaxial feature.

In some embodiments, after the forming of the germanium-containing layer, a concentration of germanium is greater in the semiconductor material layer formed over the p-type S/D epitaxial feature than the semiconductor material layer formed over the n-type S/D epitaxial feature.

In some embodiments, the processing of the semiconductor material layer includes performing an etching process. In further embodiments, the etching process implements a chlorine-containing gas.

In another aspect, the present disclosure provides a method that includes forming a first trench and a second trench in an interlayer dielectric (ILD) layer to expose a first S/D epitaxial feature formed over a first fin and a second S/D epitaxial feature formed over a second fin, respectively, depositing an n-type semiconductor layer in the first trench and the second trench, forming a germanium-containing (Ge-containing) layer over the n-type semiconductor layer, removing the Ge-containing layer from the first trench, where the removing removes the n-type semiconductor layer from the second trench, forming a silicide layer over the n-type semiconductor layer in the first trench and over the second S/D epitaxial feature in the second trench, and forming a S/D contact over the silicide layer in the first trench and the second trench, respectively. In some embodiments, the first S/D epitaxial feature is of n-type and the second S/D epitaxial feature is of p-type.

In some embodiments, the n-type semiconductor layer in the second trench includes Ge after the forming of the Ge-containing layer.

In some embodiments, where the Ge-containing layer is a first Ge-containing layer and the second S/D epitaxial feature includes a silicon germanium (SiGe) semiconductor layer, the method further includes depositing a second Ge-containing layer over the second S/D epitaxial feature before the depositing of the n-type semiconductor layer, resulting in a concentration of Ge in the second Ge-containing layer being higher than a concentration of Ge in the second S/D epitaxial feature. In further embodiments, the first Ge-containing layer includes SiGe, and the second Ge-containing layer includes SiGe, pure germanium, or a combination thereof.

In some embodiments, where the n-type semiconductor layer is a n-type first semiconductor layer and the Ge-containing layer is a first Ge-containing layer, the method further includes, before the forming of the silicide layer, depositing a second n-type semiconductor layer over the first semiconductor layer in the first trench and over the second S/D epitaxial feature in the second trench, forming a second Ge-containing layer over the second n-type semiconductor layer, and removing the second Ge-containing layer from the first trench and the second trench, where the removing removes the second n-type semiconductor layer from the second trench.

In some embodiments, where the semiconductor layer includes silicon phosphorous (SiP), the depositing of the n-type semiconductor layer forms an amorphous SiP layer over the ILD layer. In further embodiments, the forming of the Ge-containing layer removes the amorphous SiP layer from the ILD layer.

In yet another aspect, the present disclosure provides a semiconductor structure that includes a first source/drain (S/D) epitaxial feature of a first conductivity type disposed in a semiconductor layer, where the first S/D epitaxial feature has a first resistivity, a second S/D epitaxial feature of a second conductivity type different from the first conductivity type disposed in the semiconductor layer, where the first S/D and the second S/D epitaxial features are disposed adjacent their respective metal gate structures, at least one epitaxial semiconductor material layer disposed over the first S/D epitaxial feature, and a first S/D contact and a second S/D contact disposed over the epitaxial semiconductor material layer and over the second S/D epitaxial feature, respectively. In some embodiments, the epitaxial semiconductor material layer has a second resistivity lower than the first resistivity. In some embodiments, a bottom surface of second S/D contact is below a bottom surface of the first S/D contact. In some embodiments, the first conductivity type is n-type and wherein the second conductivity type is p-type.

In some embodiments, the n-type S/D epitaxial feature and the epitaxial semiconductor material layer include silicon and phosphorous. In further embodiments, a concentration of phosphorous in the n-type S/D epitaxial feature is similar to a concentration of phosphorous in the at least one epitaxial semiconductor material layer.

In some embodiments, the p-type S/D epitaxial feature includes silicon germanium, and the semiconductor structure further includes a germanium-containing layer disposed over the p-type S/D epitaxial feature, where a concentration of germanium in the germanium-containing layer is greater than a concentration of germanium in the p-type S/D epitaxial feature.

In some embodiments, the semiconductor structure further includes a silicide layer disposed between the at least one epitaxial semiconductor material layer and the first S/D contact and between the p-type S/D epitaxial feature and the second S/D contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a p-type S/D epitaxial feature and an n-type source/drain (S/D) epitaxial feature;
    forming an interlayer dielectric (ILD) layer over the p-type S/D epitaxial feature and the n-type S/D epitaxial feature;
    forming openings in the ILD layer to expose the p-type S/D epitaxial feature and the n-type S/D epitaxial feature;
    depositing a semiconductor material layer over the exposed n-type S/D epitaxial feature, the exposed p-type S/D epitaxial feature, and the ILD layer, wherein the semiconductor material layer includes an n-type semiconductor material;
    processing the semiconductor material layer to deposit a germanium-containing layer over the semiconductor material layer, wherein the depositing of the germanium-containing layer removes portions of the semiconductor material layer deposited over the ILD layer;
    removing the germanium-containing layer and selectively removing a first portion of the semiconductor material layer to expose the p-type S/D epitaxial feature but not removing a second portion of the semiconductor material over the n-type S/D epitaxial feature; and
    forming a first S/D contact over the semiconductor material layer remaining over the n-type S/D epitaxial feature and a second S/D contact over the exposed p-type S/D epitaxial feature.

2. The method of claim 1, wherein the semiconductor material layer includes silicon and phosphorous.

3. The method of claim 2, wherein a resistivity of the semiconductor material layer is lower than that of the n-type S/D epitaxial feature.

4. The method of claim 1, wherein, after the forming of the germanium-containing layer, a concentration of germanium is greater in the first portion of the semiconductor material layer formed over the p-type S/D epitaxial feature than in the second portion of the semiconductor material layer formed over the n-type S/D epitaxial feature.

5. The method of claim 1, further comprising:
    forming a first gate spacer between the p-type S/D epitaxial feature and a first gate structure; and
    forming a second gate spacer between the n-type S/D epitaxial feature and a second gate structure, wherein the depositing of the semiconductor material layer includes forming a third portion of the semiconductor material layer along the first and the second gate spacers, and wherein the processing of the semiconductor material layer further removes the semiconductor material layer from the first and the second gate spacers while depositing the germanium-containing layer.

6. The method of claim 5, wherein the removing of the semiconductor material layer implements a chlorine-containing gas.

7. The method of claim 1, further comprising, before the forming of the first and the second S/D contacts, forming a silicide layer over the semiconductor material layer remaining over the n-type S/D epitaxial feature and over the exposed p-type S/D epitaxial feature.

8. A method, comprising:
   forming a first trench and a second trench in an interlayer dielectric (ILD) layer to expose a first S/D epitaxial feature formed over a first fin and a second S/D epitaxial feature formed over a second fin, respectively, wherein the first S/D epitaxial feature is of n-type and the second S/D epitaxial feature includes germanium (Ge);
   depositing an n-type semiconductor layer in the first trench, the second trench, and on the ILD layer;
   forming a Ge-containing layer over the n-type semiconductor layer, wherein the forming of the Ge-containing layer removes portions of the n-type semiconductor layer formed on the ILD layer, and wherein the forming of the Ge-containing layer results in the n-type semiconductor layer in the second trench to have a greater concentration of Ge than the n-type semiconductor layer in the first trench;
   removing the Ge-containing layer from the first trench and the second trench, and selectively removing the n-type semiconductor layer from the second trench, thereby exposing the second S/D epitaxial feature without exposing the first S/D epitaxial feature;
   forming a silicide layer over the n-type semiconductor layer in the first trench and over the second S/D epitaxial feature in the second trench; and
   forming a S/D contact over the silicide layer in the first trench and the second trench, respectively.

9. The method of claim 8, the Ge-containing layer being a first Ge-containing layer and the second S/D epitaxial feature including a silicon germanium (SiGe) semiconductor layer, the method further comprising depositing a second Ge-containing layer over the second S/D epitaxial feature before the depositing of the n-type semiconductor layer, wherein a concentration of Ge in the second Ge-containing layer is higher than a concentration of Ge in the second S/D epitaxial feature.

10. The method of claim 9, wherein the first Ge-containing layer includes SiGe, and wherein the second Ge-containing layer includes SiGe, pure germanium, or a combination thereof.

11. The method of claim 8, the n-type semiconductor layer being first n-type semiconductor layer and the Ge-containing layer being a first Ge-containing layer, the method further comprising, before the forming of the silicide layer:
   depositing a second n-type semiconductor layer over the first n-type semiconductor layer in the first trench and over the exposed second S/D epitaxial feature in the second trench;
   forming a second Ge-containing layer over the second n-type semiconductor layer; and
   removing the second Ge-containing layer from the first trench and the second trench, wherein the removing selectively removes the second n-type semiconductor layer from the second trench but not from the first trench.

12. The method of claim 8, the n-type semiconductor layer including silicon phosphorous (SiP), wherein the depositing of the n-type semiconductor layer forms an amorphous SiP layer on the ILD layer.

13. The method of claim 12, wherein the forming of the Ge-containing layer implements a Ge-containing gas and a chlorine-containing (Cl-containing) gas, and wherein the Cl-containing gas removes the amorphous SiP layer from the ILD layer.

14. A method, comprising:
   forming an n-type source/drain (S/D) feature and a p-type S/D feature over a semiconductor substrate, wherein the n-type S/D feature is free of germanium (Ge) and the p-type S/D feature includes Ge;
   depositing a first phosphorus-doped silicon (SiP) layer on the n-type S/D feature and a second SiP layer on the p-type S/D feature;
   depositing a Ge layer over the first SiP layer and the second SiP layer, wherein the depositing of the Ge layer results in the second SiP layer to have a higher concentration of Ge than the first SiP layer;
   removing the Ge layer from over the p-type S/D feature and the n-type S/D feature, and selectively removing the second SiP layer with respect to the first SiP layer, thereby exposing the p-type S/D feature and a portion of the first SiP layer; and
   forming a first S/D contact over the exposed portion of the first SiP layer and a second S/D contact over the exposed p-type S/D feature.

15. The method of claim 14, wherein the depositing of the second SiP layer results in Ge to diffuse from the p-type S/D feature to a bottom portion of the second SiP layer.

16. The method of claim 15, wherein the depositing of the Ge layer results in Ge to diffuse from the Ge layer to a top portion of the second SiP layer, such that the concentration of Ge first decreases then increases from the Ge layer toward the p-type S/D feature.

17. The method of claim 14, a bottom portion of the first SiP layer is free of Ge after the depositing of the Ge layer.

18. The method of claim 14, wherein the depositing of the Ge layer is implemented by applying a first treatment that includes a Ge-containing gas and a chlorine-containing (Cl-containing) gas.

19. The method of claim 18, wherein the removing of the Ge layer includes applying a second treatment that includes the Cl-containing gas but is free of the Ge-containing gas.

20. The method of claim 14, the Ge layer being a first Ge layer, the method further comprising, before the forming of the first and the second S/D contact:
   depositing a third SiP layer over the exposed portion of the first SiP layer and over the exposed p-type S/D feature;
   forming a second Ge layer over the third SiP layer; and
   removing the third Ge layer from the first trench and the second trench, wherein the removing selectively removes the third SiP layer from the second trench but not from the first trench.

* * * * *